(12) United States Patent
Naganuma et al.

(10) Patent No.: US 9,425,137 B2
(45) Date of Patent: *Aug. 23, 2016

(54) WIRING BOARD

(71) Applicant: IBIDEN CO., LTD., Ogaki-shi (JP)

(72) Inventors: Nobuyuki Naganuma, Ogaki (JP);
Michimasa Takahashi, Ogaki (JP);
Masakazu Aoyama, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/552,771

(22) Filed: Nov. 25, 2014

(65) Prior Publication Data

US 2015/0075848 A1 Mar. 19, 2015

Related U.S. Application Data

(63) Continuation of application No. 12/895,126, filed on Sep. 30, 2010, now Pat. No. 8,933,556.

(60) Provisional application No. 61/297,381, filed on Jan. 22, 2010.

(51) Int. Cl.
*H01L 23/053* (2006.01)
*H01L 23/12* (2006.01)
(Continued)

(52) U.S. Cl.
CPC ... *H01L 23/49822* (2013.01); *H01L 23/49827* (2013.01); *H01L 23/49838* (2013.01); *H01L 23/5383* (2013.01); *H05K 1/0298* (2013.01); *H05K 1/092* (2013.01); *H05K 1/116* (2013.01); *H05K 1/18* (2013.01); *H05K 3/0011* (2013.01);
(Continued)

(58) Field of Classification Search
CPC .......... H01L 23/49822; H01L 23/49827; H01L 23/49838; H01L 23/5383; H05K 1/116; H05K 1/0298; H05K 3/4611; H05K 1/092; H05K 1/18; H05K 3/0094; H05K 3/0011; H05K 3/4623; H05K 2201/09545; H05K 2201/096
USPC ....... 257/621, 698, 276, 685, 686, 700, 774, 257/702; 174/251–266
See application file for complete search history.

(56) References Cited

U.S. PATENT DOCUMENTS 6,270,607 B1 * 8/2001 Tachibana .............. 156/150
8,933,556 B2 * 1/2015 Naganuma et al. ......... 257/700
(Continued)

FOREIGN PATENT DOCUMENTS

CN 1344130 A 4/2002
JP 07-147464 6/1995
(Continued)

*Primary Examiner* — Shouxiang Hu
(74) *Attorney, Agent, or Firm* — Oblon, McClelland, Maier & Neustadt, L.L.P

(57) ABSTRACT

A wiring board includes multiple insulating layers including first, second, third, fourth and fifth insulation layers laminated in the order of the first, second, third, fourth and fifth insulation layers. The first insulation layer has a first conductor including plating, the second insulation layer has a second conductor including plating, the third insulation layer has a third conductor including conductive paste, the fourth insulation layer has a fourth conductor including plating, the fifth insulation layer has a fifth conductor including plating, and the first conductor, the second conductor, the third conductor, the fourth conductor and the fifth conductor are formed along the same axis and are electrically continuous with each other.

16 Claims, 20 Drawing Sheets

(51) Int. Cl.
*H05K 1/11* (2006.01)
*H01L 23/498* (2006.01)
*H01L 23/538* (2006.01)
*H05K 3/46* (2006.01)
*H05K 1/02* (2006.01)
*H05K 1/09* (2006.01)
*H05K 1/18* (2006.01)
*H05K 3/00* (2006.01)
*H05K 3/40* (2006.01)

(52) U.S. Cl.
CPC ........... *H05K 3/0094* (2013.01); *H05K 3/4611* (2013.01); *H05K 3/4623* (2013.01); *H05K 3/4069* (2013.01); *H05K 2201/096* (2013.01); *H05K 2201/09545* (2013.01); *H05K 2201/09563* (2013.01); *H05K 2201/09854* (2013.01); *Y10T 156/1056* (2015.01)

(56) References Cited

U.S. PATENT DOCUMENTS

| | | |
|---|---|---|
| 2002/0023343 A1 | 2/2002 | Oka et al. |
| 2007/0029106 A1* | 2/2007 | Kato .............................. 174/255 |
| 2008/0053693 A1* | 3/2008 | Wu ................................. 174/265 |
| 2009/0229862 A1* | 9/2009 | Nakamura et al. ............ 174/251 |

FOREIGN PATENT DOCUMENTS

| | | |
|---|---|---|
| JP | 07-263828 | 10/1995 |
| JP | 2002-026522 | 1/2002 |
| JP | 2002-314255 | 10/2002 |
| JP | 2004-165545 | 6/2004 |
| JP | 2005-159043 | 6/2005 |
| JP | 2005-191080 | 7/2005 |

\* cited by examiner

FIG.7
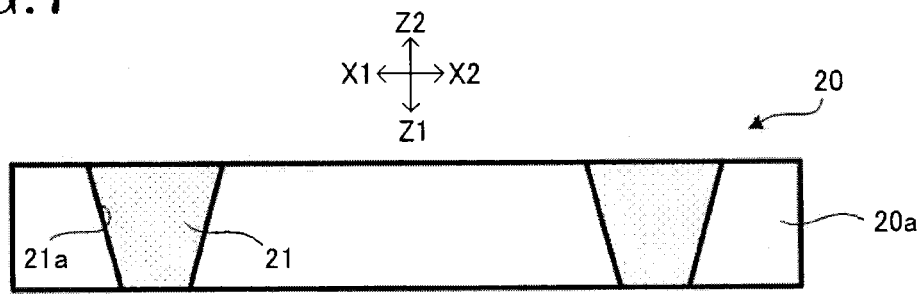
FIG.8A
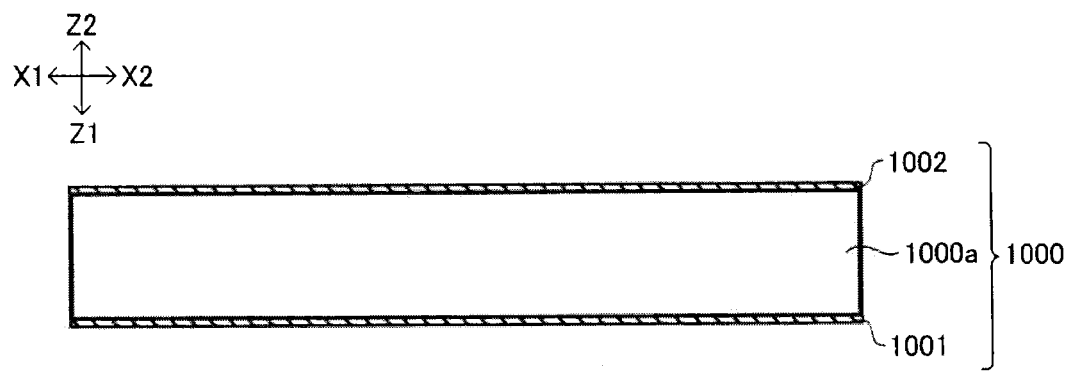
FIG.8B
FIG.8C
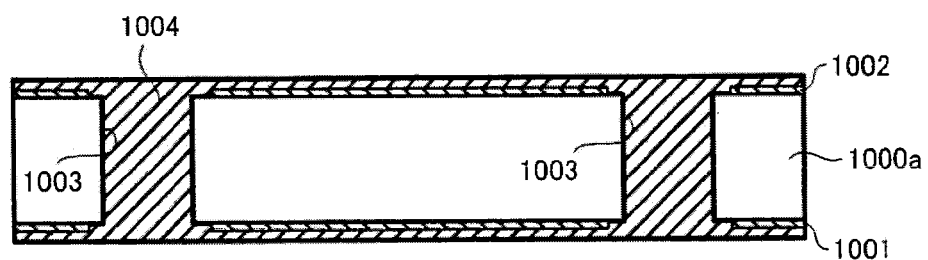

WIRING BOARD

CROSS-REFERENCE TO RELATED APPLICATIONS

The present application is a continuation of and claims the benefit of priority to U.S. application Ser. No. 12/895,126, filed Sep. 30, 2010, which claims the benefit of priority to U.S. Application No. 61/297,381, filed Jan. 22, 2010. The entire contents of these applications are incorporated herein by reference.

BACKGROUND OF THE INVENTION

1. Field of the Invention

The present invention relates to a wiring board having a multilayered core section and a method for manufacturing such a wiring board.

2. Discussion of the Background

The core section of a wiring board described in Japanese Laid-Open Patent Publication H7-147464 is structured in such a way that a connecting member is sandwiched between two circuit substrates. The connecting member has a penetrating hole in which conductive paste is filled. The core section of a wiring board described in Japanese Laid-Open Patent Publication H7-263828 is structured by laminating two or more substrates having penetrating holes in which conductive paste is filled. The contents of Japanese Laid-Open Patent Publication Nos. H7-147464 and H7-263828 are incorporated herein by reference in their entirety in the present application.

SUMMARY OF THE INVENTION

According to one aspect of the present invention, a wiring board has a laminated body having a first surface and a second surface on the opposite side of the first surface, the laminated body including a first insulation layer, a second insulation layer and a third insulation layer in the order of the first insulation layer, the second insulation layer and the third insulation layer from the first surface of the laminated body toward the second surface of the laminated body. The first insulation layer has a first hole which penetrates through the first insulation layer and includes a first conductor made of a plating formed in the first hole in the first insulation layer. The second insulation layer has a second hole which penetrates through the second insulation layer and includes a second conductor made of a conductive paste filled in the second hole of the second insulation layer. The third insulation layer has a third hole which penetrates through the third insulation layer and includes a third conductor made of a plating formed in the third hole in the third insulation layer. The first conductor, the second conductor and the third conductor are positioned along the same axis and are electrically continuous with each other.

According to another aspect of the present invention, a method for manufacturing a wiring board includes preparing a first insulation layer having a first hole which penetrates through the first insulation layer and including a first conductor made of a plating formed in the first hole in the first insulation layer, preparing a second insulation layer having a second hole which penetrates through the second insulation layer and including a second conductor made of a conductive paste filled in the second hole of the second insulation layer, preparing a third insulation layer having a third hole which penetrates through the third insulation layer and including a third conductor made of a plating formed in the third hole in the third insulation layer, positioning the first insulation layer, the second insulation layer and the third insulation layer in the order of the first insulation layer, the second insulation layer and the third insulation layer such that the first conductor, the second conductor and the third conductor are positioned along the same axis, and forming a laminated body having a first surface and a second surface on the opposite side of the first surface such that the first insulation layer, the second insulation layer and the third insulation layer in the order of the first insulation layer, the second insulation layer and the third insulation layer from the first surface of the laminated body toward the second surface of the laminated body and that the first conductor, the second conductor and the third conductor are electrically continuous with each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7 is a view showing the manufactured second substrate;

FIG. 8A is a view to illustrate a first step of a method for manufacturing a first substrate and a third substrate;

FIG. 8B is a view to illustrate a second step subsequent to the step in FIG. 8A;

FIG. 8C is a view to illustrate a third step subsequent to the step in FIG. 8B;

FIG. 19A is a view showing a first alternative example of a horizontal cross-sectional shape of a filled conductor or the like;

FIG. 19B is a view showing a second alternative example of a horizontal cross-sectional shape of a filled conductor or the like;

FIG. 19C is a view showing a third alternative example of a horizontal cross-sectional shape of a filled conductor or the like;

DETAILED DESCRIPTION OF THE EMBODIMENTS

Figure 1:
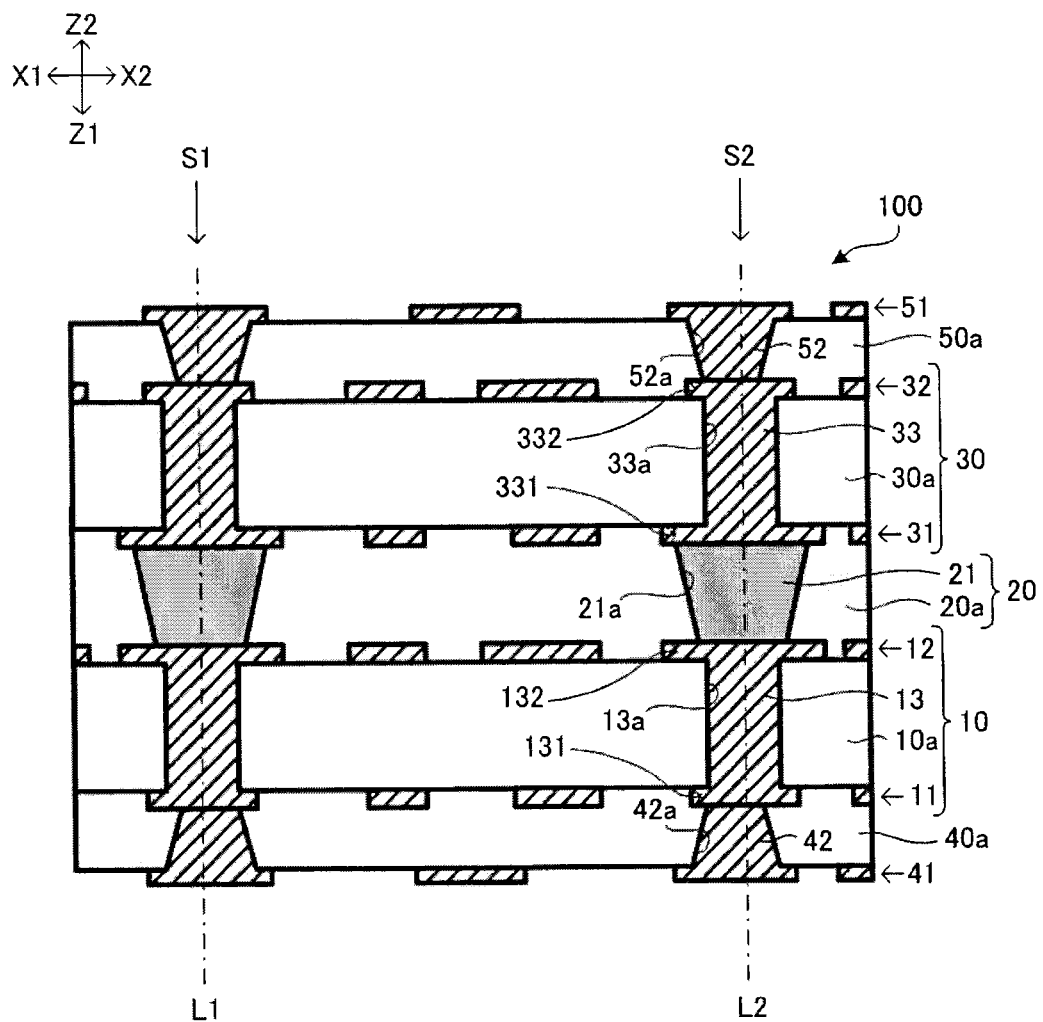
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Side surfaces of a wiring board are on the X-Z plane or the Y-Z plane.

Regarding a filled conductor or its hole, a cross section perpendicular to directions Z (X-Y plane) is referred to as a horizontal cross section. Also, a cross section parallel to directions Z (X-Z plane or Y-Z plane) is referred to as a vertical cross section.

"Preparing" includes situations in which material and parts are purchased and manufactured accordingly, as well as situations in which finished products are purchased and used accordingly.

Also, "pressing and heating" may be conducted simultaneously or separately.

In the present embodiment, two main surfaces facing opposite directions along a normal line are referred to as a first surface (the surface on the Z1 side) and a second surface (the surface on the Z2 side). Namely, a main surface opposite a first surface is a second surface, and a main surface opposite the second surface is the first surface. In lamination directions, a side closer to the core is referred to as a lower layer (or an inner-layer side) and a side farther away from the core is referred to as an upper layer (or an outer-layer side).

Aside from a layer including a conductive pattern that functions as wiring such as circuits (including ground), a layer with only a plain pattern is also referred to as a wiring layer. Among the conductors formed inside holes, the conductive film formed on the wall surfaces (side surface and bottom surface) of a hole is called a conformal conductor, and the conductor filled in a hole is called a filled conductor. Lands of filled conductors along with the above conductive patterns may be included in wiring layers.

Plating indicates depositing layered conductors (such as metal) on surfaces of metal or resin as well as the deposited conductive layers (such as a metal layer). Plating includes wet plating such as electrolytic plating and electroless plating and dry plating such as PVD (Physical Vapor Deposition), CVD (Chemical Vapor Deposition) and the like.

Unless specifically indicated, the "width" of a hole or a cylinder (protruding portion) indicates the diameter if it is a circle, and $2\sqrt{}$ (cross sectional area/$\pi$) if it is other than a circle. If a hole or a cylinder (protruding portion) tapers, whether "widths" in two or more holes or protruding portions are the same or not the same may be determined by comparing the values of corresponding portions, average values, or maximum values and the like. Regarding a line pattern formed on a surface, among the directions perpendicular to the line, the measurement in a direction parallel to the surface on which the line is formed is referred to as "width," and the measurement in a direction perpendicular to the surface on which the line is formed is referred to as "height" or "thickness." In addition, the measurement from one end of the line to the other end is referred to as "length." However, measurements are not limited to the above definitions if they are clearly indicated otherwise.

Wiring board 100 of the present embodiment is a printed wiring board. As shown in FIG. 1, wiring board 100 has first substrate 10, second substrate 20, third substrate 30, insulation layers (40*a*, 50*a*), wiring layers (41, 51) and filled conductors (42, 52) (fourth conductors). First substrate 10, second substrate 20 and third substrate 30 correspond to the core section. Insulation layers (40*a*, 50*a*) and others positioned as upper layers to the core section correspond to built-up sections.

Figure 2A:
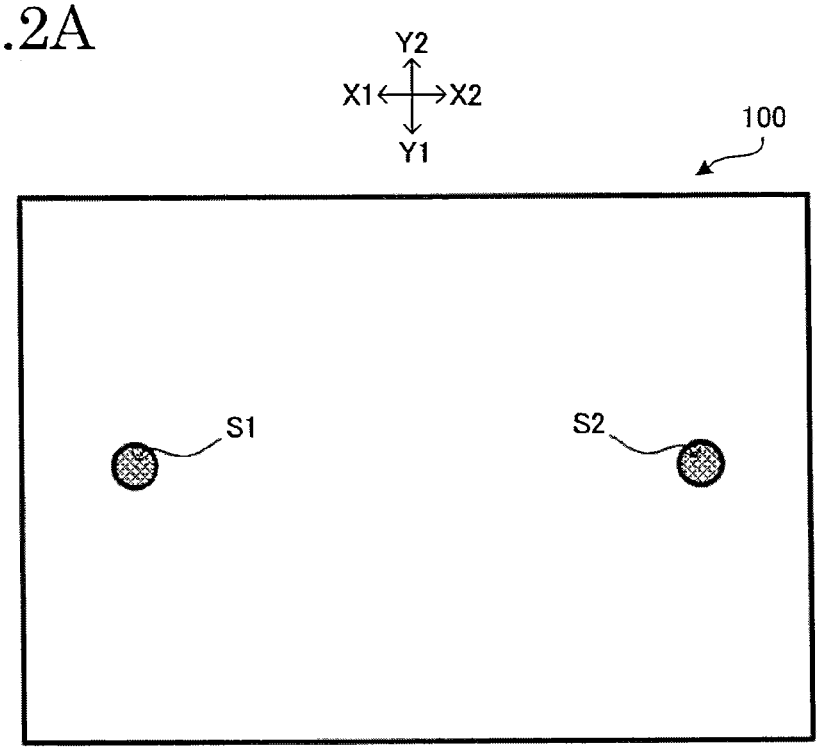
FIG. 2A is a plan view showing a first positioning of filled stack structures.
Figure 2B:
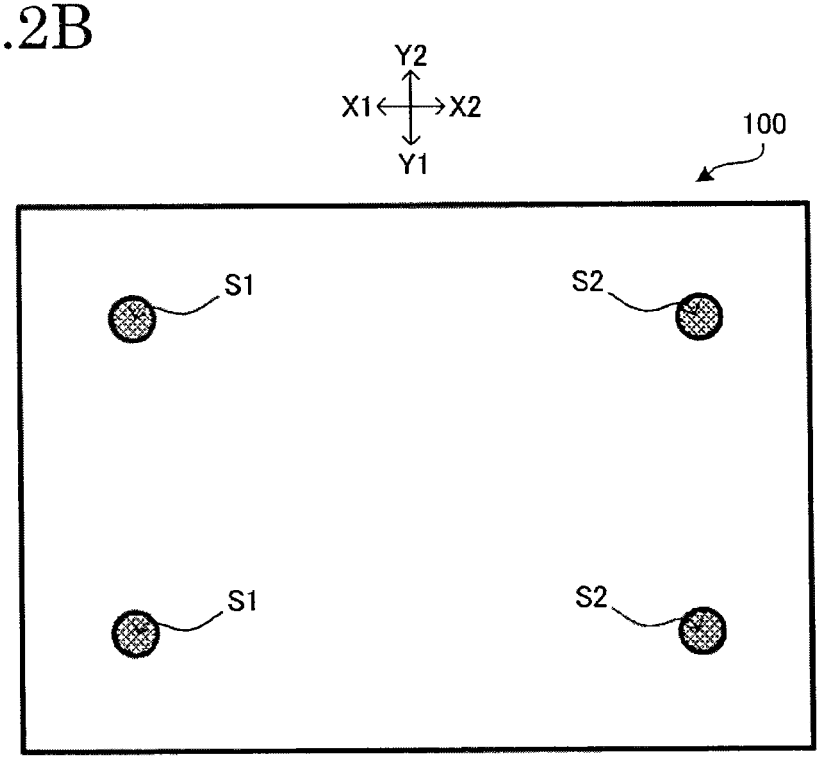
FIG. 2B is a plan view showing a second positioning of filled stack structures.

In wiring board 100, by positioning the filled conductors of the core section (first substrate 10, second substrate 20 and third substrate 30) and filled conductors (42, 52) of the built-up sections along the same axes (along axis (L1), axis (L2)), filled stack structures (S1, S2) are extended along directions Z. Filled stack structures (S1, S2) each electrically connect the conductive patterns on both surfaces of wiring board 100, namely, wiring layer 41 on the first surface and wiring layer 51 on the second surface. The positioning and the number of filled stack structures (S1, S2) are not limited specifically. Filled stack structure (S1) or (S2) may be positioned one each at either end of wiring board 100 as shown in FIG. 2A, for example, or may be positioned one each at the four corners of wiring board 100 as shown in FIG. 2B, for example. The number of filled stack structures may be one. (for details, see later-described FIGS. 13-15).

First substrate 10 has first insulation layer (10*a*), wiring layers (11, 12) and first filled conductor 13 (first conductor). In first insulation layer (10*a*), first hole (13*a*) which penetrates through first insulation layer (10*a*) is formed. First filled conductor 13 is formed by filling plating in first hole (13*a*). Land 131 is connected to the first-surface side of first filled conductor 13 and land 132 is connected to the second-surface side of first filled conductor 13. Land 131 is included in wiring layer 11, and land 132 is included in wiring layer 12.

First insulation layer (10*a*) is made of epoxy resin, for example. Epoxy resin is preferred to contain a reinforcing material such as glass fiber (glass fabric or glass non-woven fabric, for example) and aramid fiber (aramid non-woven fabric, for example) impregnated with resin, for example. The reinforcing material has a smaller thermal expansion coefficient than the primary material (epoxy resin in the present embodiment).

Wiring layers (11, 12) are made of copper foil or copper plating, for example. Also, filled conductor 13 is made of copper plating, for example. The size, shape or the like of first filled conductor 13 will be described later.

Third substrate 30 has third insulation layer (30a), wiring layers (31, 32) and third filled conductor 33 (third conductor). In third insulation layer (30a), third hole (33a) which penetrates through third insulation layer (30a) is formed. Third filled conductor 33 is formed by filling plating in third hole (33a). Land 331 is connected to the first-surface side of third filled conductor 33 and land 332 is connected to the second-surface side of third filled conductor 33. Land 331 is included in wiring layer 31, and land 332 is included in wiring layer 32.

Third insulation layer (30a) is made of epoxy resin, for example. Epoxy resin is preferred to contain a reinforcing material such as glass fiber (glass fabric or glass non-woven fabric, for example) and aramid fiber (aramid non-woven fabric, for example) impregnated with resin, for example. The reinforcing material has a smaller thermal expansion coefficient than the primary material (epoxy resin in the present embodiment).

Wiring layers (31, 32) are made of copper foil or copper plating, for example. Also, third filled conductor 33 is made of copper plating, for example. The size, shape or the like of third filled conductor 33 will be described later.

Second substrate 20 has second insulation layer (20a) and second filled conductor 21 (second conductor). In second insulation layer (20a), second hole (21a) which penetrates through second insulation layer (20a) is formed. Land 132 is connected to the first-surface side of second filled conductor 21 and land 331 is connected to the second-surface side of second filled conductor 21.

Second filled conductor 21 is formed by filling conductive paste in second hole (21a). Conductive paste indicates those in which conductive particles are mixed in a viscous binder at a predetermined concentration. A binder indicates a resin or the like that bonds between particles. Conductive paste is distinguished from plating.

Second insulation layer (20a) is made of epoxy resin, for example. Epoxy resin is preferred to contain a reinforcing material such as glass fiber (glass fabric or glass non-woven fabric, for example) and aramid fiber (aramid non-woven fabric, for example) impregnated with resin, for example. The reinforcing material has a smaller thermal expansion coefficient than the primary material (epoxy resin in the present embodiment).

The conductive paste forming second filled conductor 21 is copper paste, for example. The size, shape or the like of second filled conductor 21 will be described later.

Insulation layer (40a) is laminated on the first-surface side of first insulation layer (10a), and insulation layer (50a) is laminated on the second-surface side of third insulation layer (30a). Insulation layers (40a, 50a) correspond to interlayer insulation layers. Hole (42a) which penetrates through insulation layer (40a) is formed in insulation layer (40a). Also, hole (52a) which penetrates through insulation layer (50a) is formed in insulation layer (50a). Insulation layer (40a) has filled conductor 42, and insulation layer (50a) has filled conductor 52. Filled conductor 42 is formed by filling plating in hole (42a) and filled conductor 52 is formed by filling plating in hole (52a). Wiring layer 41 is formed on the first surface of insulation layer (40a) and wiring layer 51 is formed on the second surface of insulation layer (50a).

Wiring layers (41, 51) are made of copper foil or copper plating, for example. Also, as the material for insulation layers (40a, 50a), the following may be used: those made by impregnating base material such as glass fabric or aramid fabric with resins such as epoxy resin, polyester resin, bismaleimide triazine resin (BT resin), imide resin (polyimide), phenol resin, or allyl polyphenylene ether resin (A-PPE resin).

Filled conductors (42, 52) are made of copper plating, for example. Filled conductor 42 is formed to be a tapered cylinder, widening from the second-surface side toward the first-surface side, for example. Filled conductor 52 is formed to be a tapered cylinder, widening from the first-surface side toward the second-surface side, for example.

Along axis (L1) and axis (L2), filled conductor 42, first filled conductor 13, second filled conductor 21, third filled conductor 33 and filled conductor 52 are laminated in that order from the first-surface side toward the second-surface side. Adjacent filled conductors are adhered to (in contact with) each other, and are electrically continuous with each other. Filled stack structure (S1) is formed along axis (L1), and filled stack structure (S2) is formed along axis (L2). Filled stack structures (S1, S2) each have a structure where filled conductors throughout the layers are arranged along the same axis, a so-called full stack structure. Accordingly, it is easier to secure wiring regions, and flexibility in designing wiring patterns will increase. In addition, since wiring either on directions X or directions Y may be omitted, reduction in wiring lengths in interlayer connections may be achieved. A full-stack structure is not always required (see later-described FIG. 17).

Wiring board 100 of the present embodiment has second substrate 20 as a middle layer of the core section. In addition, since metal is not the only material filled in second filled conductor 21 of second insulation layer 20, it is thought that wiring board 100 may become stronger against the impact of being dropped or thermal impacts.

On the other hand, first substrate 10 and third substrate 30 positioned respectively on both sides (first-surface side, second-surface side) of second substrate 20 each have a filled conductor (first filled conductor 13, third filled conductor 33) made of plating. Resistance in plating is usually lower than resistance in conductive paste. Thus, resistance in wiring board 100 of the present embodiment is thought to be lower than in a wiring board having conductive paste in its all layers. Therefore, enhanced energy efficiency or the like may be expected.

In the following, the sizes and shapes of first filled conductor 13, second filled conductor 21 and third filled conductor 33 are described by referring to FIG. 3 (cross-sectional view) and FIG. 4 (plan view of FIG. 3).

Figure 3:
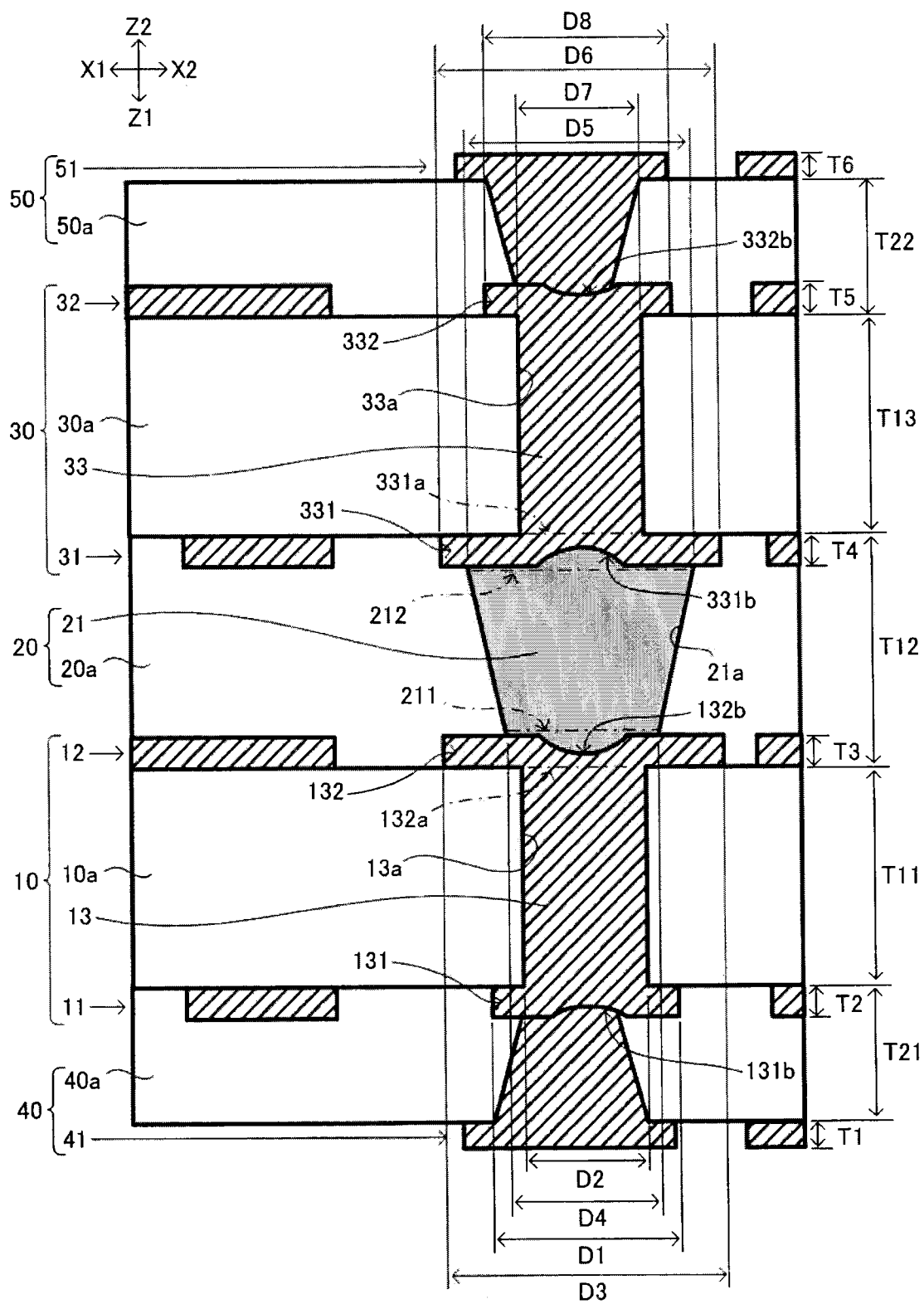
FIG. 3 is a cross-sectional view to illustrate sizes and shapes in a filled stack structure.

In FIG. 3, thickness (T11) of first insulation layer (10a), thickness (T12) of second insulation layer (20a) and thickness (T13) of third insulation layer (30a) in the core section are set to be 100-200 µm, for example. Meanwhile, thickness (T21) of insulation layer (40a) and thickness (T22) of insulation layer (50a) in the built-up sections are set to be 60 µm, for example.

Also, thickness (T2) of wiring layer 11, thickness (T3) of wiring layer 12, thickness (T4) of wiring layer 31 and thickness (T5) of wiring layer 32 in the core section are set to be 30 µm, for example. Meanwhile, thickness (T1) of wiring layer 41 and thickness (T6) of wiring layer 51 in the built-up sections are set to be 25 μm, for example.

As described above, in wiring board 100 of the present embodiment, any one of thickness (T11) of first insulation layer (10a), thickness (T12) of second insulation layer (20a) and thickness (T13) of third insulation layer (30a) is set greater than thickness (T21) of insulation layer (40a) or thickness (T22) of insulation layer (50a). Also, any one of thickness (T2) of wiring layer 11, thickness (T3) of wiring layer 12, thickness (T4) of wiring layer 31 and thickness (T5) of wiring layer 32 in the core section is set greater than thickness (T1) of wiring layer 41 or thickness (T6) of wiring layer 51. If set at such sizes, it will be advantageous for impedance control. In the following, the reasons are provided.

In a printed wiring board, it is required to match impedance values at a constant level, and their measurement and control are necessary. When measuring actual impedance values, a stripline or a microstrip is formed in an inner layer to measure such values. In a stripline or a microstrip, the greater the thickness of an insulative body (insulation layer), the greater the impedance, and the greater the width and thickness of the transmission line (wiring layer), the smaller the impedance. Thus, if impedance control is conducted by using a thin insulation layer, it is accordingly required that a thin transmission line, which is the object of the measurement, be formed. If a transmission line is made thin, since forming such a thin line is difficult, the risk that impedance will be out of the acceptable range may increase, and a lowered yield rate may become a concern. To prevent such a situation, it may be an option to carry out pseudo-impedance control by using two insulation layers where a blank region without a wiring layer is formed in one insulation layer directly on the other insulation layer. However, since the region on a wiring board, including the blank region, to be used for impedance control increases in such a method, designing highly integrated wiring may be remarkably hampered. For that matter, in wiring board 100 of the present embodiment, thicknesses (T11-T13) of first through third insulation layers (10a, 20a, 30a) are set great. If thicknesses (T11-T13) are set great, it is possible to increase accordingly the width and thickness of transmission lines which are the measurement objects. As a result, impedance control will become easier. Moreover, since the thicknesses of wiring layers to be formed on such insulation layers, namely, thicknesses (T2-T5) are set great, forming wiring layers in the core section will become easier.

If at least thickness (T11) of first insulation layer (10a), thickness (T12) of second insulation layer (20a) or thickness (T13) of third insulation layer (30a) is set greater than thickness (T21) of insulation layer (40a) or thickness (T22) of insulation layer (50a), substantially the same effect as above may be achieved. However, the effect will be smaller in such a situation. Also, if at least thickness (T2) of wiring layer 11, thickness (T3) of wiring layer 12, thickness (T4) of wiring layer 31 or thickness (T5) of wiring layer 32 is set greater than thickness (T1) of wiring layer 41 or thickness (T6) of wiring layer 51, substantially the same effect as above may be achieved. However, the effect will be smaller in such a situation.

Figure 4:
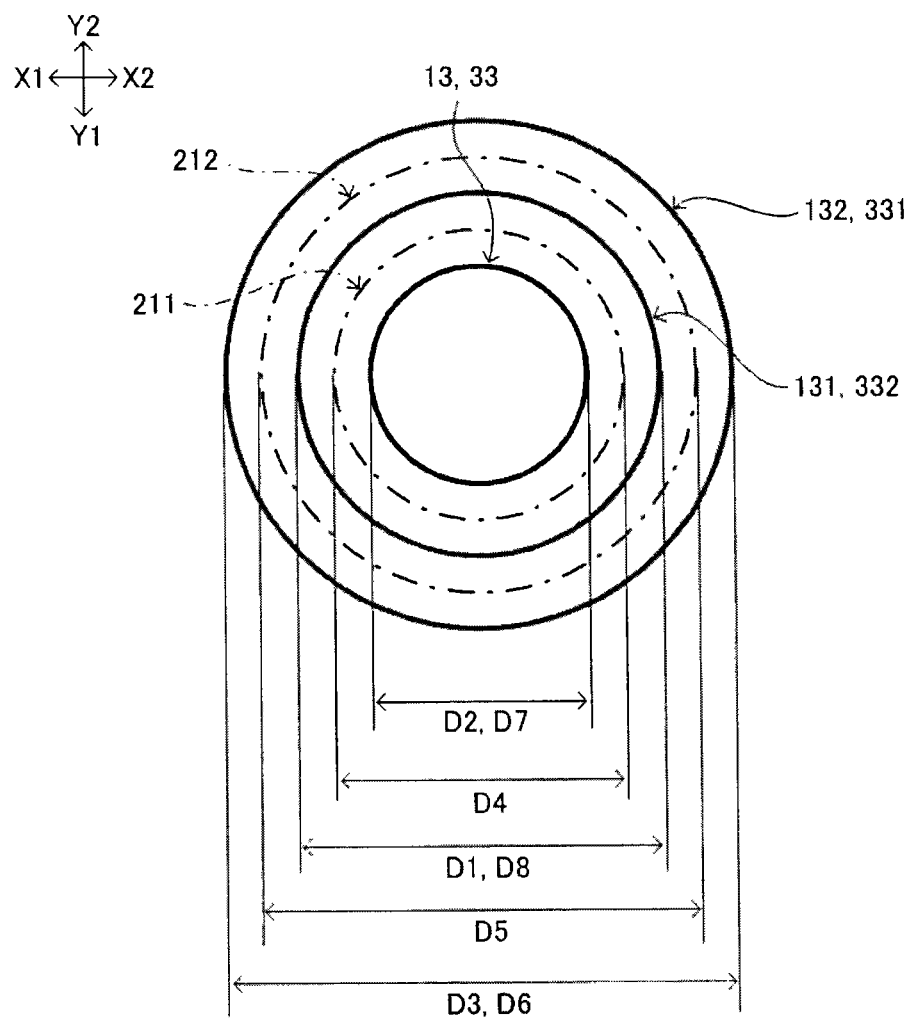
FIG. 4 is a plan view to illustrate the sizes and shapes in the filled stack structure.

As shown in FIGS. 3 and 4, first filled conductor 13 (or first hole 13a) and third filled conductor 33 (or third hole 33a) are formed to be cylindrical. Accordingly, widths of first filled conductor 13 and third filled conductor 33 will become uniform widths (D2, D7) respectively. Therefore, the width of opening (132a) on the second-surface side of first hole (13a) will also be (D2), and the width of opening (331a) on the first-surface side of third hole (33a) will also be (D7). On the other hand, second filled conductor 21 (or second hole 21a) is formed to be a tapered cylinder, widening from the first-surface side toward the second-surface side. Thus, width (D5) of opening 212 on the second-surface side of second hole (21a) is set greater than width (D4) of opening 211 on the first-surface side of second hole (21a). However, first filled conductor 13 or the like is not limited to being formed as above, and their configuration may be determined freely (see later-described FIGS. 19A-22).

Width (D1) of land 131 is 250 μm, for example; width (D2) of first filled conductor 13 is 75 μm, for example; width (D3) of land 132 is 350 μm, for example; width (D4) of opening 211 on the first-surface side of second hole (21a) is 130 μm, for example; width (D5) of opening 212 on the second-surface side of second hole (21a) is 200 μm, for example; width (D6) of land 331 is 350 μm, for example, width (D7) of third filled conductor 33 is 75 μm, for example; and width (D8) of land 332 is 250 μm, for example.

Width (D4) of opening 211 on the first-surface side of second hole (21a) is set greater than width (D2) of opening (132a) on the second-surface side of first hole (13a) (D4>D2). Also, width (D5) of opening 212 on the second-surface side of second hole (21a) is set greater than width (D7) of opening (331a) on the first-surface side of third hole (33a) (D5>D7). By increasing the width of second filled conductor 21 as above, where the alignment on both surfaces is required, determining positions of first filled conductor 13, second filled conductor 21 and third filled conductor 33 will become easier. Here, satisfying relationships such as "D4>D2" and "D5>D7" is not always required. For example, if either one of such relationships is satisfied, substantially the same effect as above will be achieved. However, if both relationships are satisfied, the effect will be multiplied.

Figure 11:
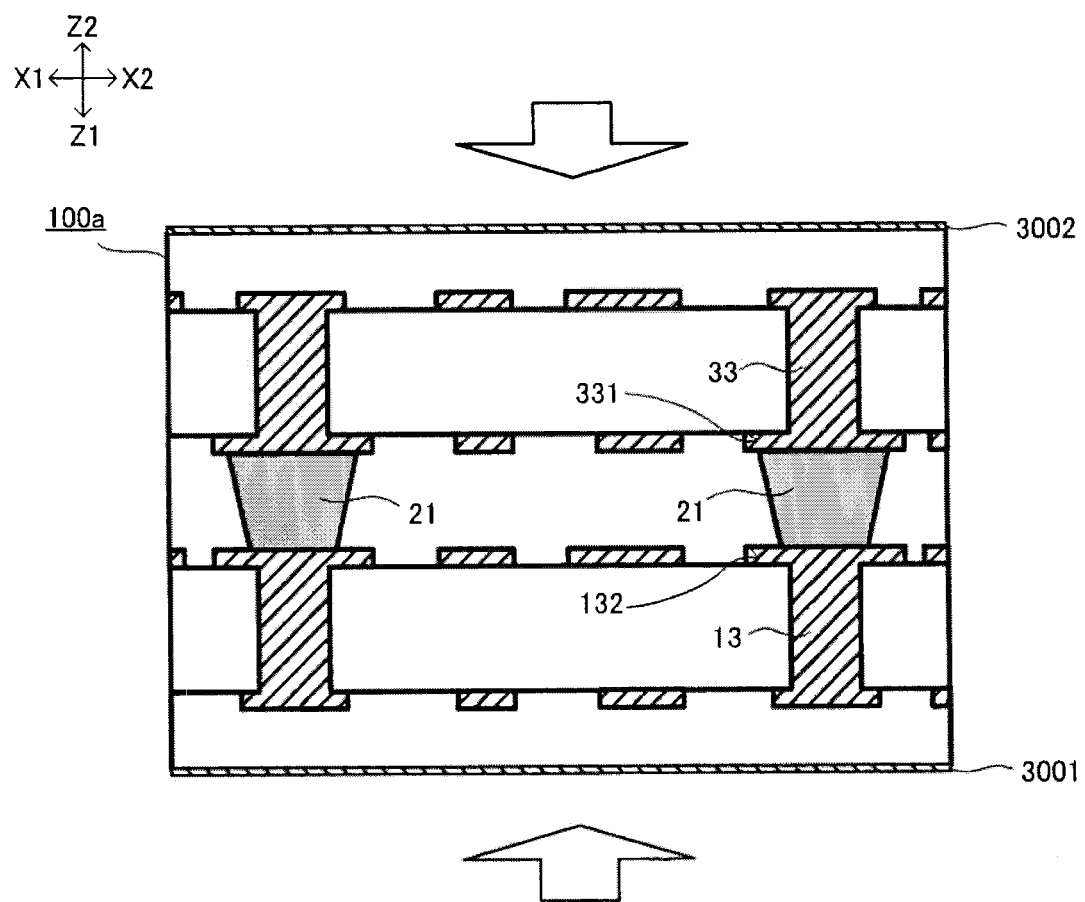
FIG. 11 is a view to illustrate a pressing step.

Width (D3) of land 132 is set greater than width (D1) of land 131 (D3>D1), and width (D6) of land 331 is set greater than width (D8) of land 332 (D6>D8). Since width (D3) of land 132 and width (D6) of land 331 are set greater, securing the connection area with second filled conductor 21 will become easier in a later-described pressing step (FIG. 11). Determining the positions of first filled conductor 13, second filled conductor 21 and third filled conductor 33 will become easier. Also, since width (D1) of land 131 and width (D8) of land 332 are smaller, securing the wiring region will become easier, and flexibility in designing wiring patterns will increase. Here, satisfying relationships such as "D3>D1" and "D6>D8" is not always required. For example, if either one of such relationships is satisfied, substantially the same effect as above will be achieved. However, if both relationships are satisfied, the effect will be multiplied.

When filled conductors are formed by plating, recesses tend to occur on the surfaces of filled conductors. Thus, situations in which such recesses are formed are described in the present embodiment. Namely, as shown in FIG. 3, recess (131b) is formed in the central portion of the first-surface-side end surface of first filled conductor 13 (the surface of land 131), and recess (132b) is formed in the central portion of the second-surface-side end surface of first filled conductor 13 (the surface of land 132). Recess (331b) is formed in the central portion of the first-surface-side end surface of third filled conductor 33 (the surface of land 331), and recess (332b) is formed in the central portion of the second-surface-side end surface of third filled conductor 33 (the surface of land 332). Such recess (132b) or the like tends to cause voids to occur. However, second filled conductor 21 in the core section of wiring board 100 is made of highly fluid conductive paste. Then, the conductive paste in filled conductor 21 flows into recesses (132*b*, 331*b*). Accordingly recesses (132*b*, 331*b*) are leveled with conductive paste, and voids are suppressed from occurring.

As shown in FIG. 4, land 131, first filled conductor 13, land 132, second filled conductor 21 (opening 211, opening 212), land 331, third filled conductor 33 and land 332 are positioned in concentric circles in the present embodiment. Accordingly, an increase in contact areas and a reduction of wiring lengths are achieved. As a result, excellent electrical characteristics are achieved. However, it is not always required for the centers to overlap (see later-described FIGS. 16 and 17).

Figure 5:
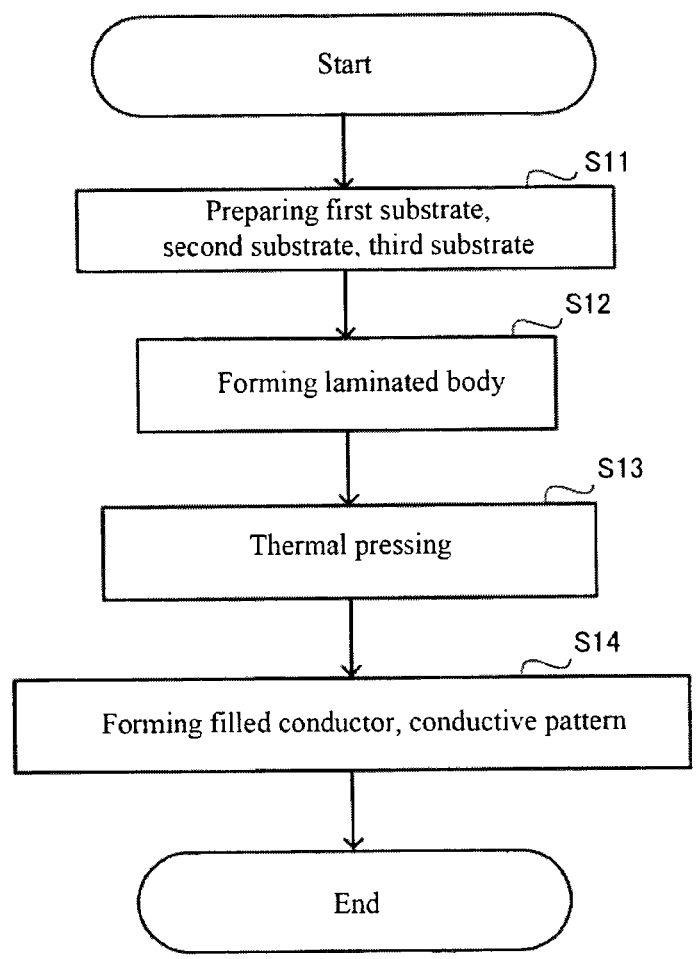
FIG. 5 is a flowchart showing a method for manufacturing a wiring board according to an embodiment of the present invention.

The above wiring board 100 is manufactured according to the procedures shown in FIG. 5, for example.

In step (S11), first substrate 10, second substrate 20 and third substrate 30 are prepared.

Figure 6A:
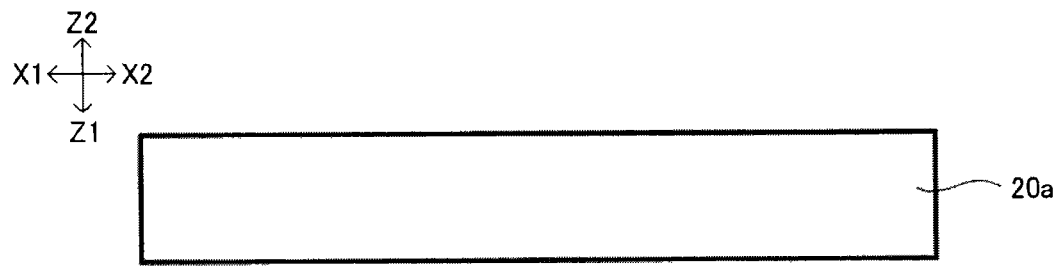
FIG. 6A is a view to illustrate a first step of a method for manufacturing a second substrate.
Figure 6B:
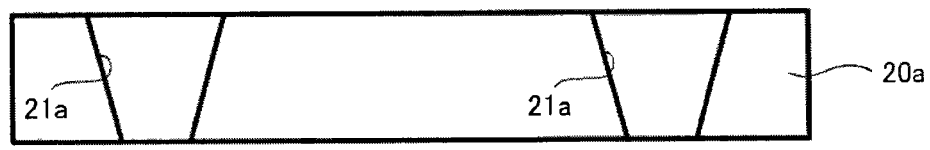
FIG. 6B is a view to illustrate a second step subsequent to the step in FIG. 6A.
Figure 6C:
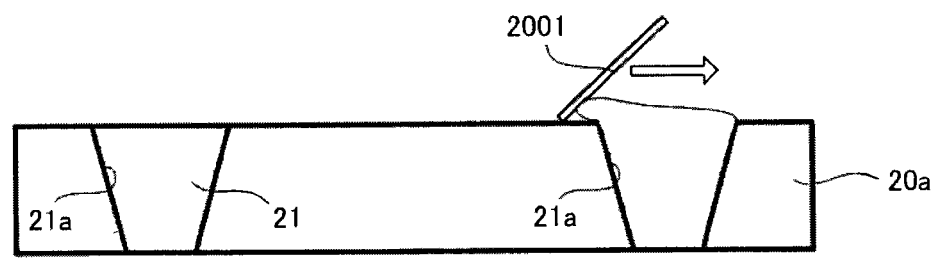
FIG. 6C is a view to illustrate a third step subsequent to the step in FIG. 6B.

A method for manufacturing second substrate 20 is shown in FIGS. 6A-6C.

As shown in FIG. 6A, second insulation layer (20*a*) (starting material) is prepared. At this stage, second insulation layer (20*a*) is a prepreg (semi-cured adhesive sheet). The material for second insulation layer (20*a*) is epoxy resin containing reinforcing material, for example, as described previously.

As shown in FIG. 6B, second holes (21*a*) are formed in second insulation layer (20*a*) by a laser. Second holes (21*a*) penetrate through second insulation layer (20*a*). Desmearing and soft etching are conducted if required.

As shown in FIG. 6C, conductive paste is printed on second insulation layer (20*a*) using squeegee 2001. In doing so, conductive paste is filled in second holes (21*a*), and second filled conductors 21 are formed. As a result, as shown in FIG. 7, second substrate 20 is completed. Second holes (21*a*) may be filled by laminating detachable film on both surfaces (first surface and second surface), by forming an adhesive layer on both surfaces, or by using conductive paste with low viscosity, and then conductive paste with high viscosity is added on top of those so that conductive paste will protrude from both surfaces.

A method for manufacturing first substrate 10 and third substrate 30 is shown in FIGS. 8A-8C.

As shown in FIG. 8A, double-sided copper-clad laminate 1000 (starting material) is prepared. Double-sided copper-clad laminate 1000 has insulation layer (1000*a*) and copper foils (1001, 1002). Copper foil 1001 is formed on the first surface of insulation layer (1000*a*), and copper foil 1002 is formed on the second surface of insulation layer (1000*a*). The material for insulation layer (1000*a*) is epoxy resin containing reinforcing material, for example.

As shown in FIG. 8B, holes 1003 are formed in double-sided copper-clad laminate 1000 by a laser. Holes 1003 penetrate through double-sided copper-clad laminate 1000. Desmearing and soft etching are conducted if required.

As shown in FIG. 8C, plating 1004 is filled in holes 1003 by copper panel plating (plating in through holes and on the entire surface). Although omitted from the drawings, if previously mentioned recesses (131*b*, 132*b*, 331*b*, 332*b*) are formed, they are formed on the surface of plating 1004 (especially in the central portions of holes 1003) at this stage. When first substrate 10 and third substrate 30 are manufactured, their manufacturing processes are the same up to this step. Here, insulation layer (1000*a*) corresponds to first insulation layer (10*a*) or third insulation layer (30*a*). Plating 1004 filled in holes 1003 corresponds to first filled conductor 13 or third filled conductor 33.

Figure 9A:
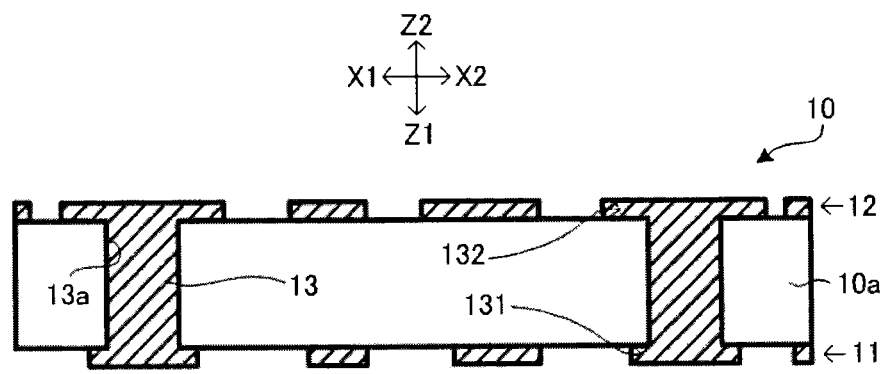
FIG. 9A is a view showing the manufactured first substrate.
Figure 9B:
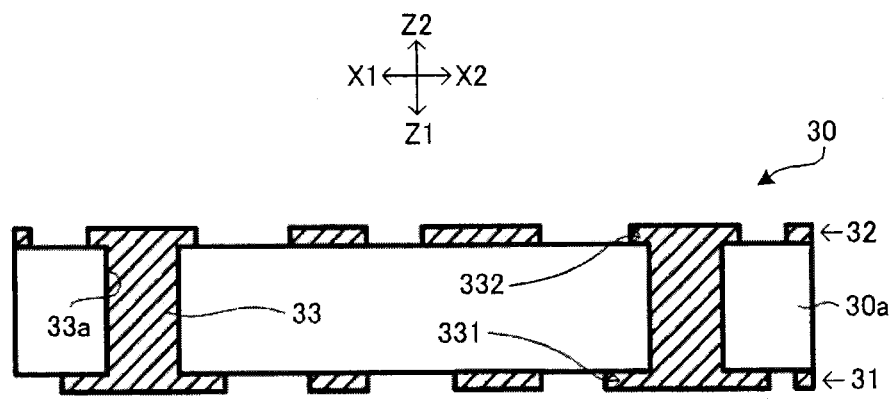
FIG. 9B is a view showing the manufactured third substrate.

As shown in FIG. 9A or 9B, using a lithographic technique, for example, conductive layers on both surfaces of insulation layer (1000*a*) (first insulation layer (10*a*) or third insulation layer (30*a*)) are patterned for each of first substrate 10 and third substrate 30. Each pattern is formed to satisfy previously described sizes or the like (see FIGS. 3 and 4). Accordingly, wiring layers (11, 12) are formed on the first surface and the second surface of first insulation layer (10*a*), and wiring layers (31, 32) are formed on the first surface and second surface of third insulation layer (30*a*). As a result, first substrate 10 and third substrate 30 are completed.

Figure 10:
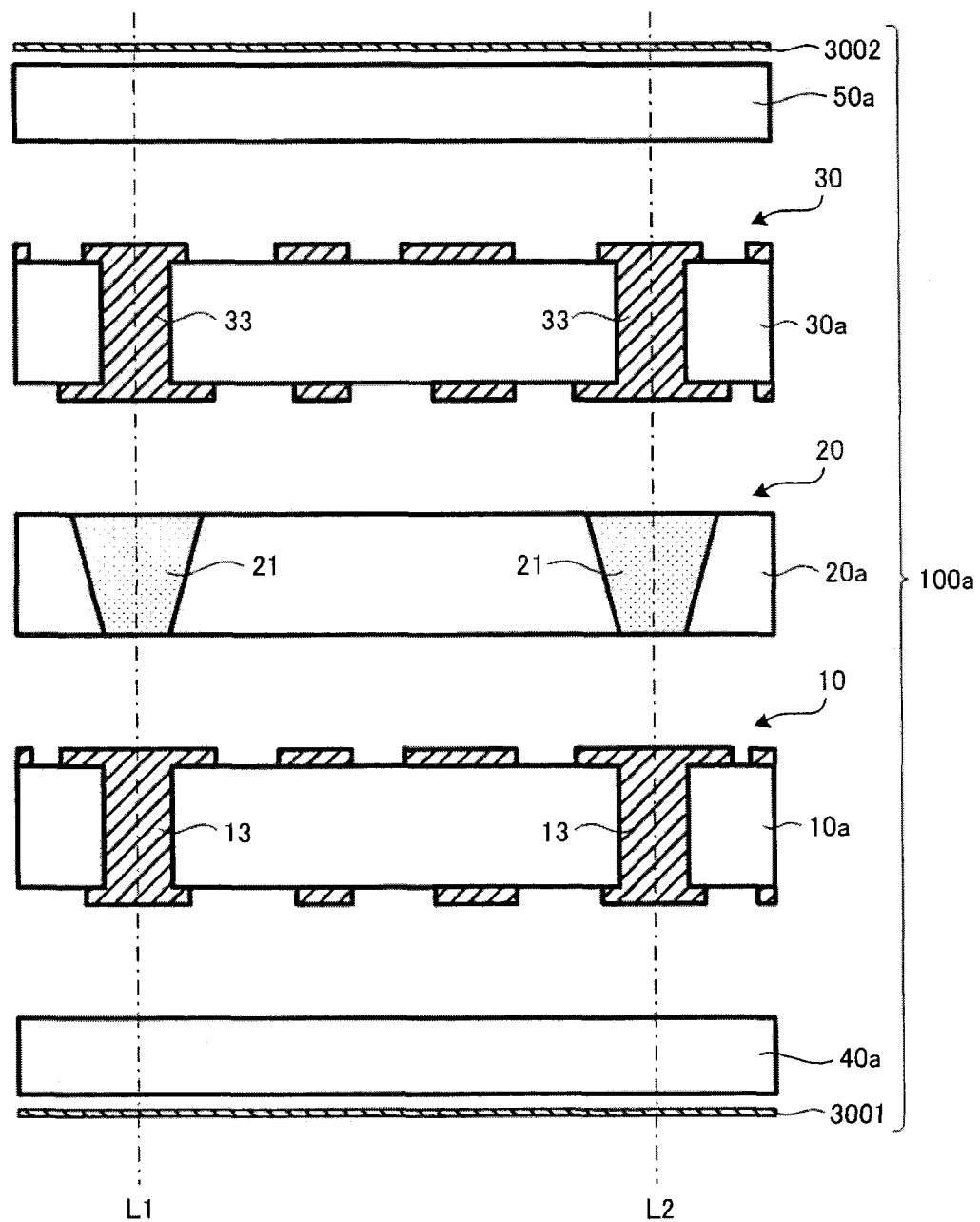
FIG. 10 is a view to illustrate a step for forming a laminated body.

In step (S12) of FIG. 5, copper foil 3001, insulation layer (40*a*), first substrate 10, second substrate 20, third substrate 30, insulation layer (50*a*) and copper foil 3002 are laminated so that first filled conductor 13, second filled conductor 21 and third filled conductor 33 will be positioned along the same axes (axis (L1), axis (L2)) as shown in FIG. 10. Accordingly, laminated body 100 is formed. Second insulation layer (20*a*) is sandwiched between first insulation layer (10*a*) and third insulation layer (30*a*), and then they are further sandwiched between insulation layers (40*a*, 50*a*). At this stage, insulation layers (40*a*, 50*a*) are prepregs (semi-cured adhesive sheets). However, instead of a prepreg, RCF (resin-coated copper foil) or the like may also be used.

An example of the thermal expansion coefficient of each member at this stage is shown. The thermal expansion coefficient of first filled conductor 13 is 17 ppm/° C., for example; the thermal expansion coefficient of second filled conductor 21 is 30-40 ppm/° C., for example; and the thermal expansion coefficient of third filled conductor 33 is 17 ppm/° C., for example. The thermal expansion coefficient of first insulation layer (10*a*) and third insulation layer (30*a*) is 12-14 ppm/° C., for example; the thermal expansion coefficient of second insulation layer (20*a*) is 11-13 ppm/° C., for example; and the thermal expansion coefficient of insulation layers (40*a*, 50*a*) is 12-14 ppm/° C., for example. If RCF is used, the thermal expansion coefficient of insulation layers (40*a*, 50*a*) is 60-80 ppm/° C., for example.

In step (S13) of FIG. 5, laminated body (100*a*) is thermal pressed all at once as shown in FIG. 11. Namely, pressing and heating are conducted simultaneously. Prepregs (second insulation layer (20*a*) and the like) are cured and members are adhered by pressing and heating. As a result, laminated body (100*a*) will be integrated. Adjacent filled conductors are adhered to (in contact with) each other, and first filled conductor 13, second filled conductor 21 and third filled conductor 33 become electrically continuous with each other. The conductive paste forming second filled conductor 21 flows into recesses (132*b*, 331*b*) (FIG. 3). Also, second filled conductor 21 is compressed from both sides (Z1 side and Z2 side) by highly rigid land 331 and land 132. Here, the pressing and heating may be divided into multiple procedures. Alternatively, the heating and pressing may be conducted separately; however, if conducted simultaneously, it will be more efficient. After thermal pressing, another heating treatment may be conducted separately for integration.

In step (S14) of FIG. 5, filled conductors (42, 52) and conductive patterns (wiring layers 41, 51) are formed.

Figure 12A:
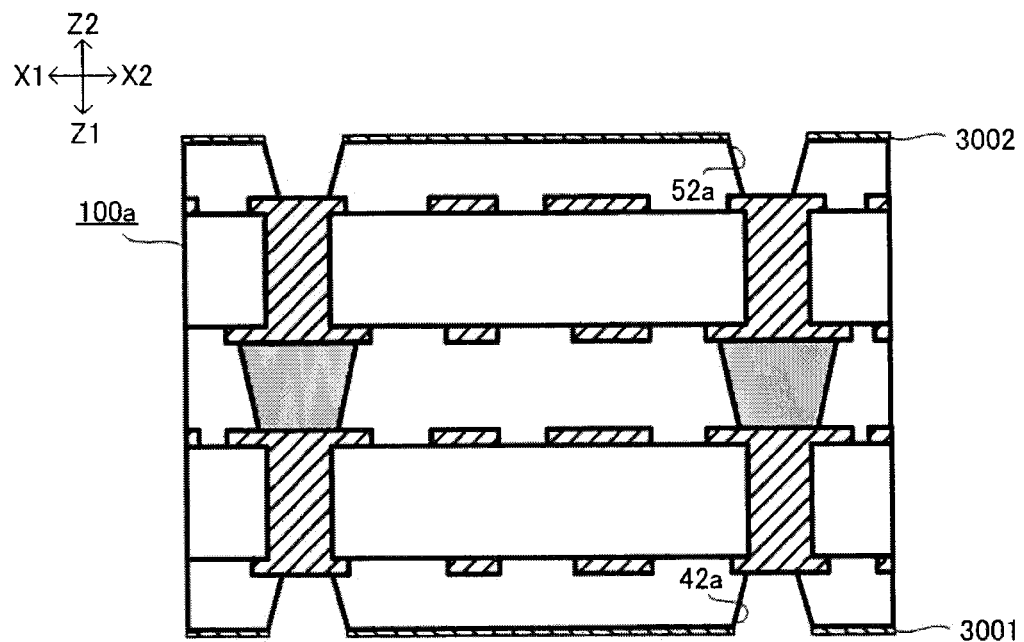
FIG. 12A is a view to illustrate a step for forming holes in insulation layers.

As shown in FIG. 12A, holes (42*a*) are formed in insulation layer (40*a*) and holes (52*a*) are formed in insulation layer (50*a*) by a laser, for example. Desmearing and soft etching are conducted if required.

Figure 12B:
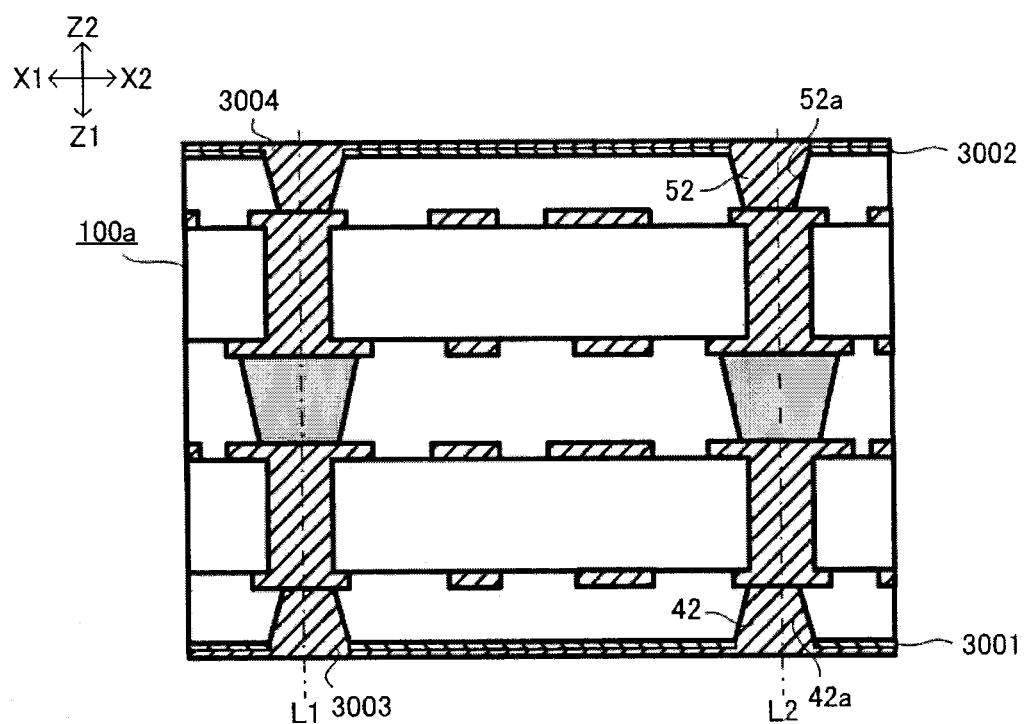
FIG. 12B is a view to illustrate a plating step.

As shown in FIG. 12B, plating 3003 is filled in holes (42*a*) and plating 3004 is filled in holes (52*a*) by copper panel plating (such as chemical copper plating and copper electroplating), for example. In doing so, filled conductors (42, 52) are formed. Filled conductors (42, 52) are positioned along the same axes (axis (L1), axis (L2)) as first filled conductor 13, second filled conductor 21 and third filled conductor 33.

Furthermore, using a lithographic technique, for example, conductive layers on both surfaces are patterned. Accordingly, as shown previously in FIG. 1, wiring layer 41 is formed on insulation layer (40a) and wiring layer 51 is formed on insulation layer (50a). As a result, wiring board 100 is completed. By forming external connection terminals in the outermost layers, connecting wiring board 100 to another wiring board or mounting an electronic component on wiring board 100 may be achieved by means of such external connection terminals.

A method for forming conductive patterns is not limited specifically. For example, wiring layers (41, 51) may be formed by selectively performing plating on portions to be patterned by using plating resist, a so-called pattern plating method.

In a method for manufacturing wiring board 100 according to the present embodiment, the core section (first substrate 10, second substrate 20, third substrate 30) and the lowermost insulation layers in the built-up sections (insulation layers (40a, 50a)) are pressed all at once (see FIGS. 10, 11). Accordingly, wiring board 100 may be manufactured with fewer pressing times.

Also, since second insulation layer (20a) before thermal pressing is a prepreg, adhesiveness to first insulation layer (10a) and third insulation layer (30a) is high.

So far, a wiring board and its manufacturing method according to an embodiment of the present invention have been described. However, the present invention is not limited to the above embodiment.

Figure 13:
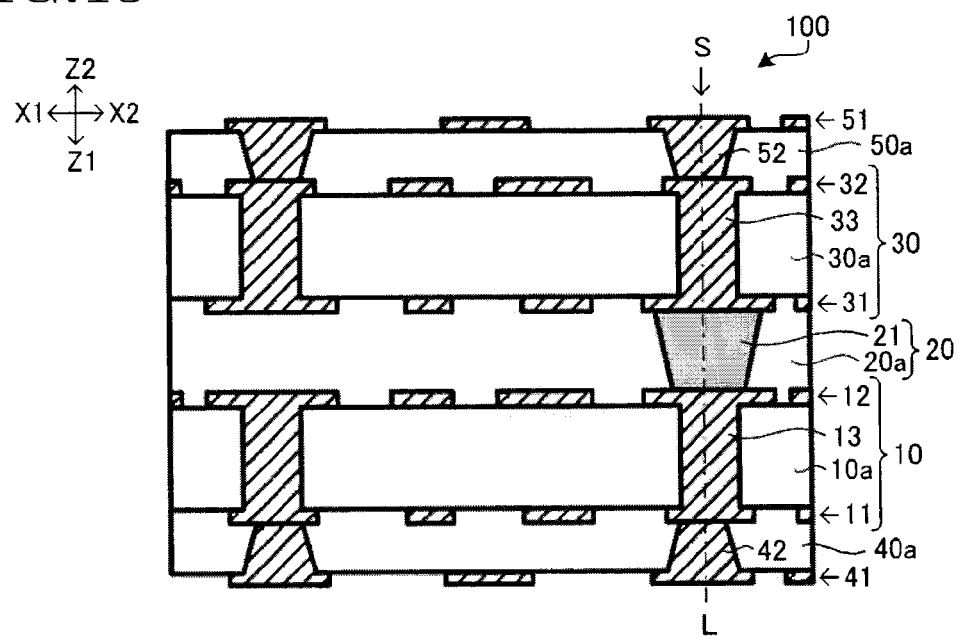
FIG. 13 is a cross-sectional view showing another example in which the number of filled stack structures is modified.
Figure 14:
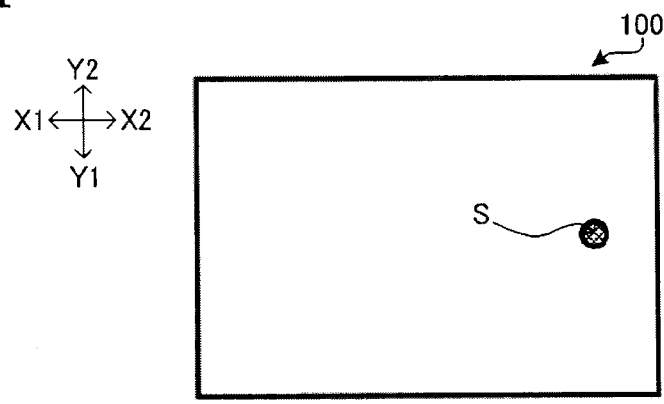
FIG. 14 is a plan view showing a first positioning regarding the example in FIG. 13.
Figure 15:
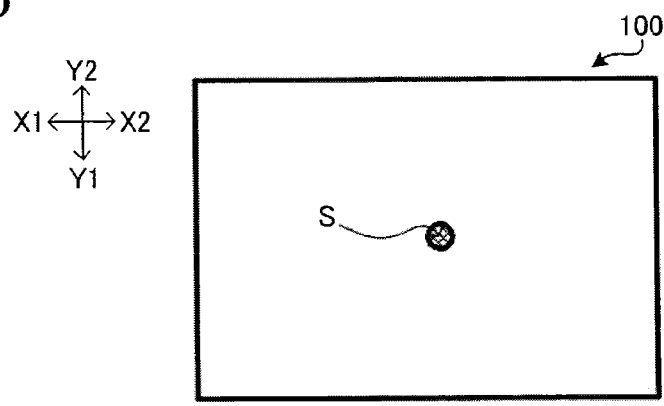
FIG. 15 is a plan view showing a second positioning regarding the example in FIG. 13.

The number of filled stack structures is not limited specifically. For example, as shown in FIG. 13 (cross-sectional view) and FIG. 14 (plan view of FIG. 13), the number of filled stack structures "S" may be one. Filled stack structure "S" may be positioned away from the center of wiring board 100 as shown in FIG. 14; or as shown in FIG. 15, it may be positioned in the center (such as the position of gravity center) of wiring board 100.

Figure 16:
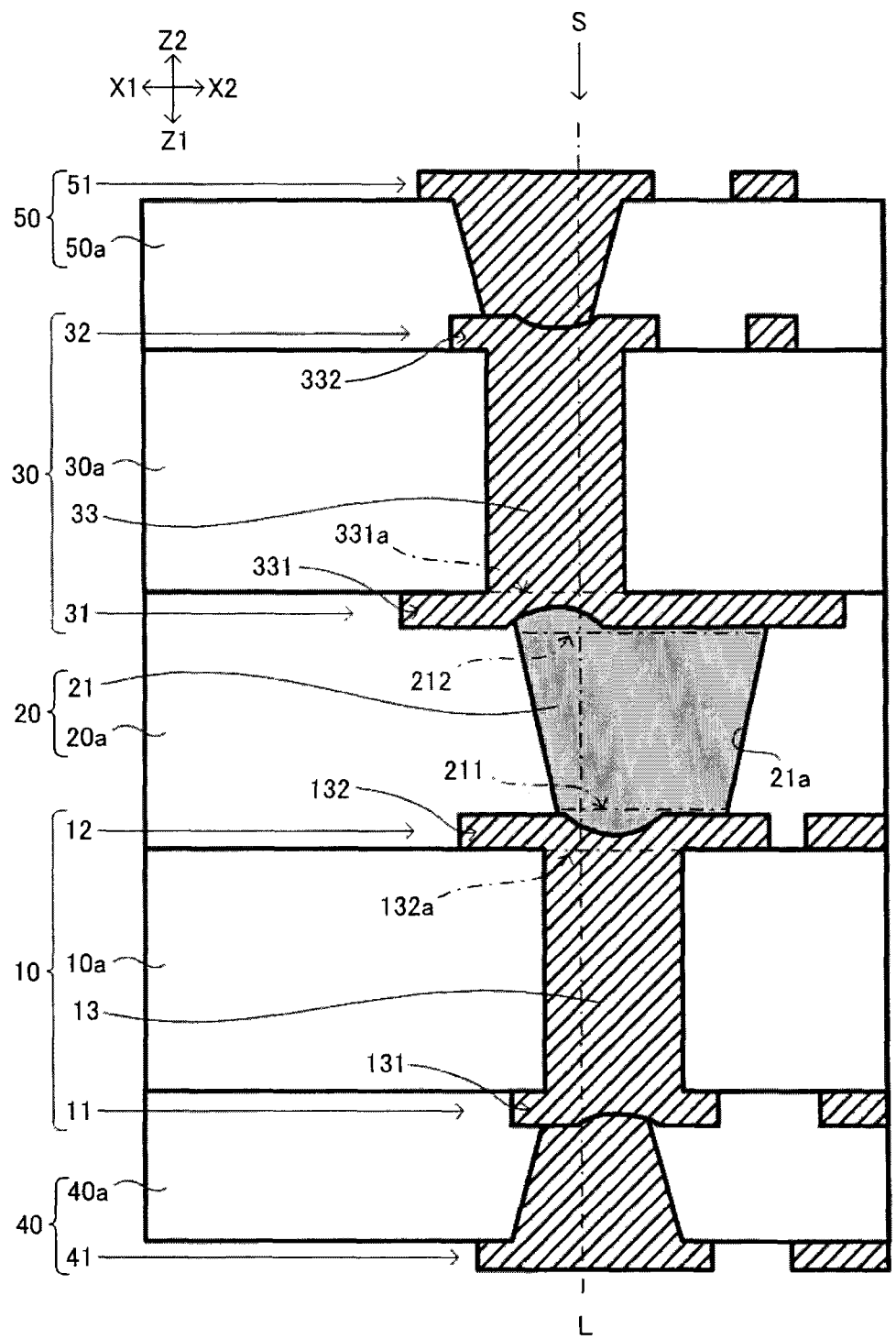
FIG. 16 is a cross-sectional view showing a full stack structure where filled conductors are not positioned in concentric circles.

As shown in FIG. 16, even if land 131, first filled conductor 13, land 132, second filled conductor 21 (opening 211, opening 212), land 331, third filled conductor 33 and land 332 are not positioned in concentric circles, a full stack structure may be formed in wiring board 100.

Figure 17:
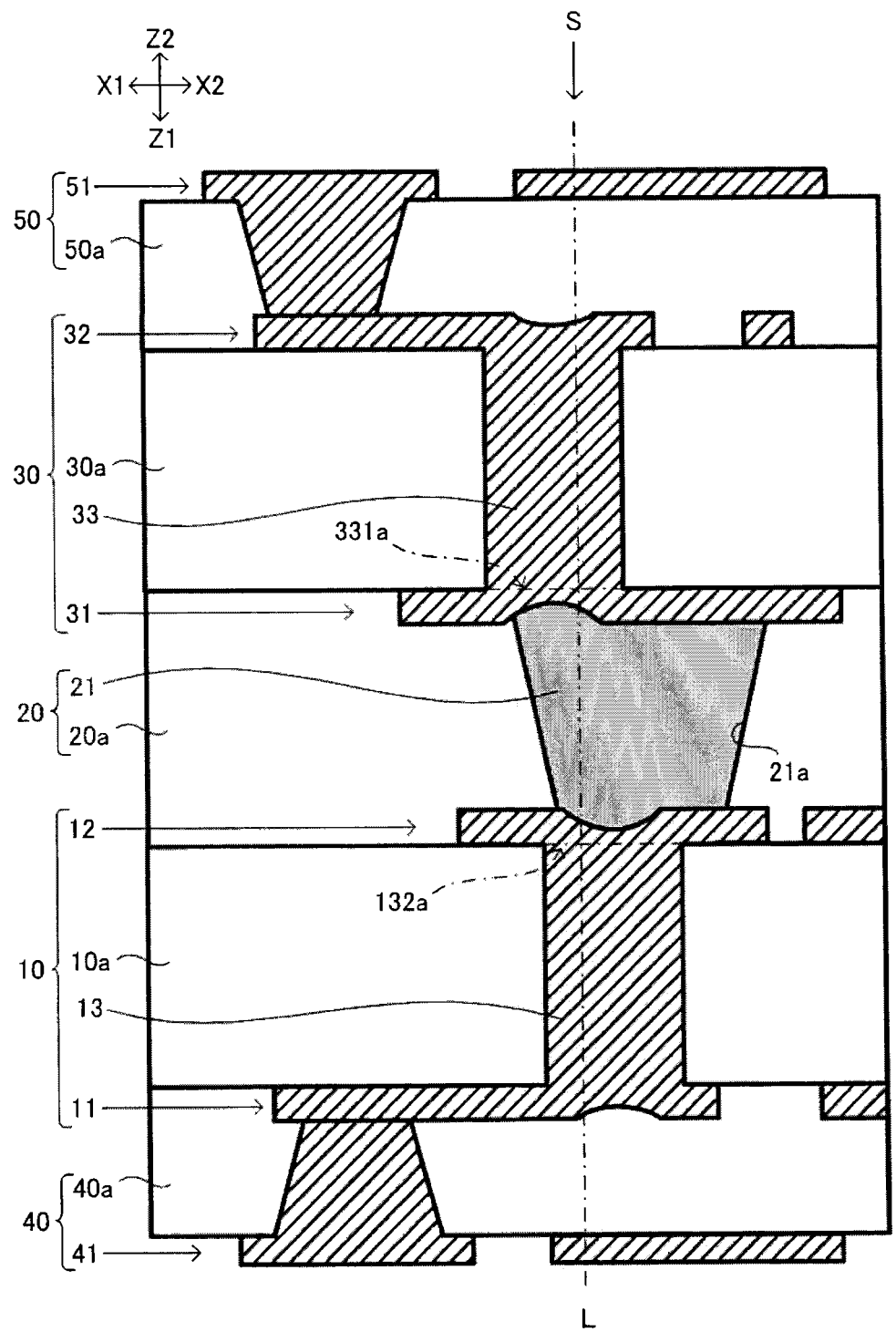
FIG. 17 is a cross-sectional view showing a wiring board which does not have a full stack structure.

A full stack structure is not always required. For example, as shown in FIG. 17, as long as at least first filled conductor 13, second filled conductor 21 and third filled conductor 33 are positioned along the same axis, effects such as reduction in wiring lengths or the like may be achieved as described previously. However, a full stack structure will result in greater effects.

Figure 18:
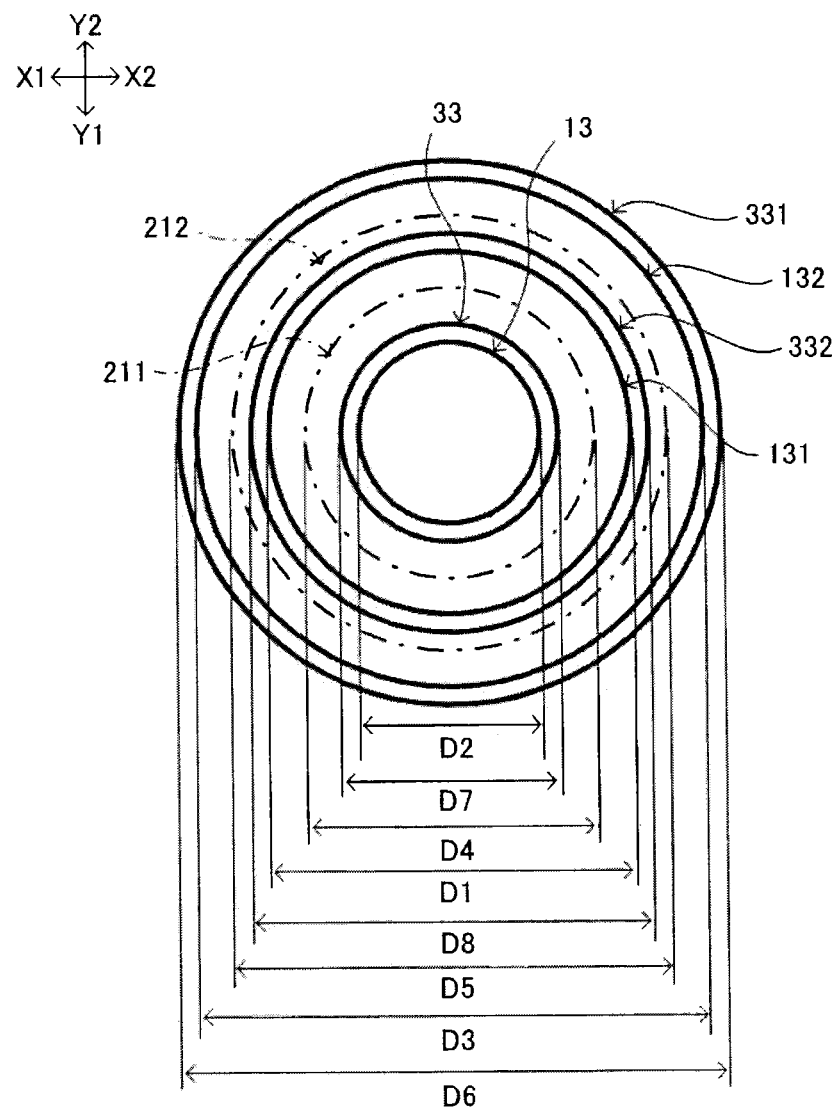
FIG. 18 is a plan view showing another example in which the sizes in a filled stack structure are modified.

It is not always required for the size to be the same within each pair of width (D1) of land 131 and width (D8) of land 332, width (D2) of first filled conductor 13 and width (D7) of third filled conductor 33, and width (D3) of land 132 and width (D6) of land 331. As shown in FIG. 18, such pairings may have different sizes.

Figure 19A:
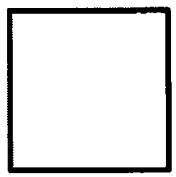

The horizontal cross sections (X-Y plane) of filled conductors and their lands are not limited to a circle (completely round circle), and any other type may be employed. Those cross sections may be formed to be a square, as shown in FIG. 19A, for example, or any other regular polygons such as a regular hexagon, a regular octagon or the like. In addition, the shape of angles of such polygons is not limited specifically; for example, it may be a right angle, an acute angle or an obtuse angle, or it may even be roundish. However, to prevent thermal stresses from being concentrated, it is preferred that the angles be roundish.

Also, the shape of the above horizontal cross sections may be oval, rectangular, triangular or the like. However, such shapes have disadvantages due to their anisotropic characteristics.

The above circles, ovals and regular polygons have advantages since their shapes tend to be similar to the shape of the holes.

Figure 19B:
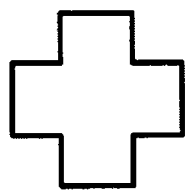
Figure 19C:
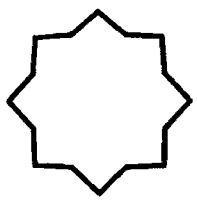

Alternatively, as shown in FIG. 19B or 19C, shapes such as a cross or a regular polygonal star formed by drawing straight lines to radiate out from the center (shapes in which multiple spokes are positioned in a radial pattern) may be effective as the shape of the above horizontal cross sections.

Figure 20:
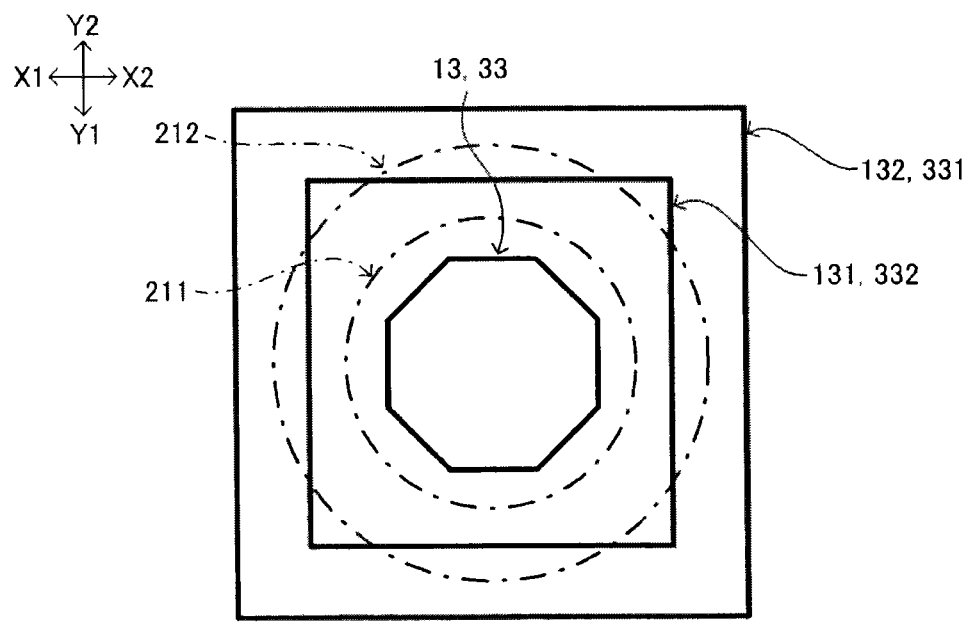
FIG. 20 is a view showing an example in which a similar shapes are combined for filled conductors and their lands.

The above shapes may be freely combined and employed for the shapes of filled conductors and their lands. For example, as shown in FIG. 20, asimilar shapes may be combined for filled conductors and their lands.

Figure 21:
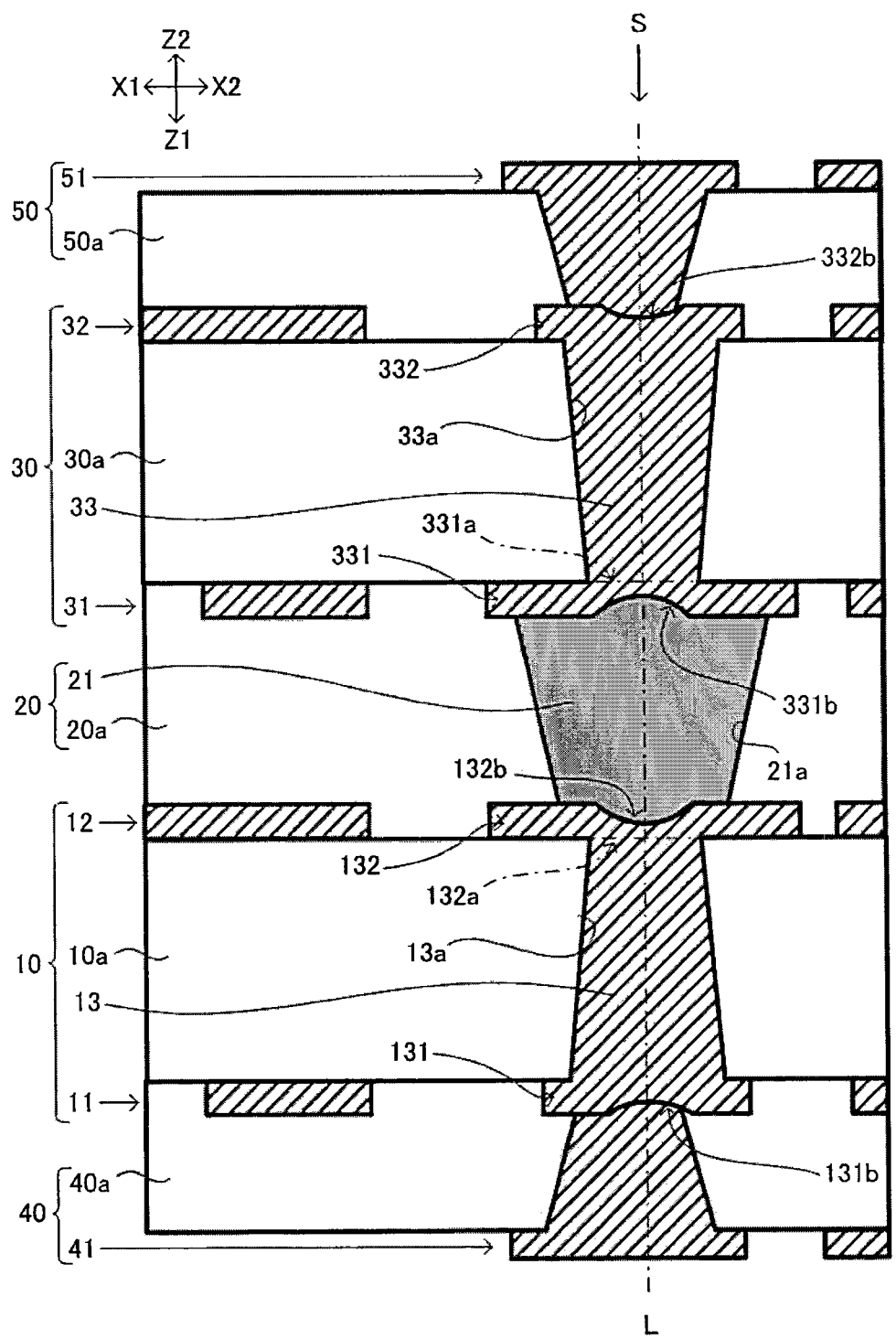
FIG. 21 is a view showing a first alternative example of a vertical cross-sectional shape of filled conductors.
Figure 22:
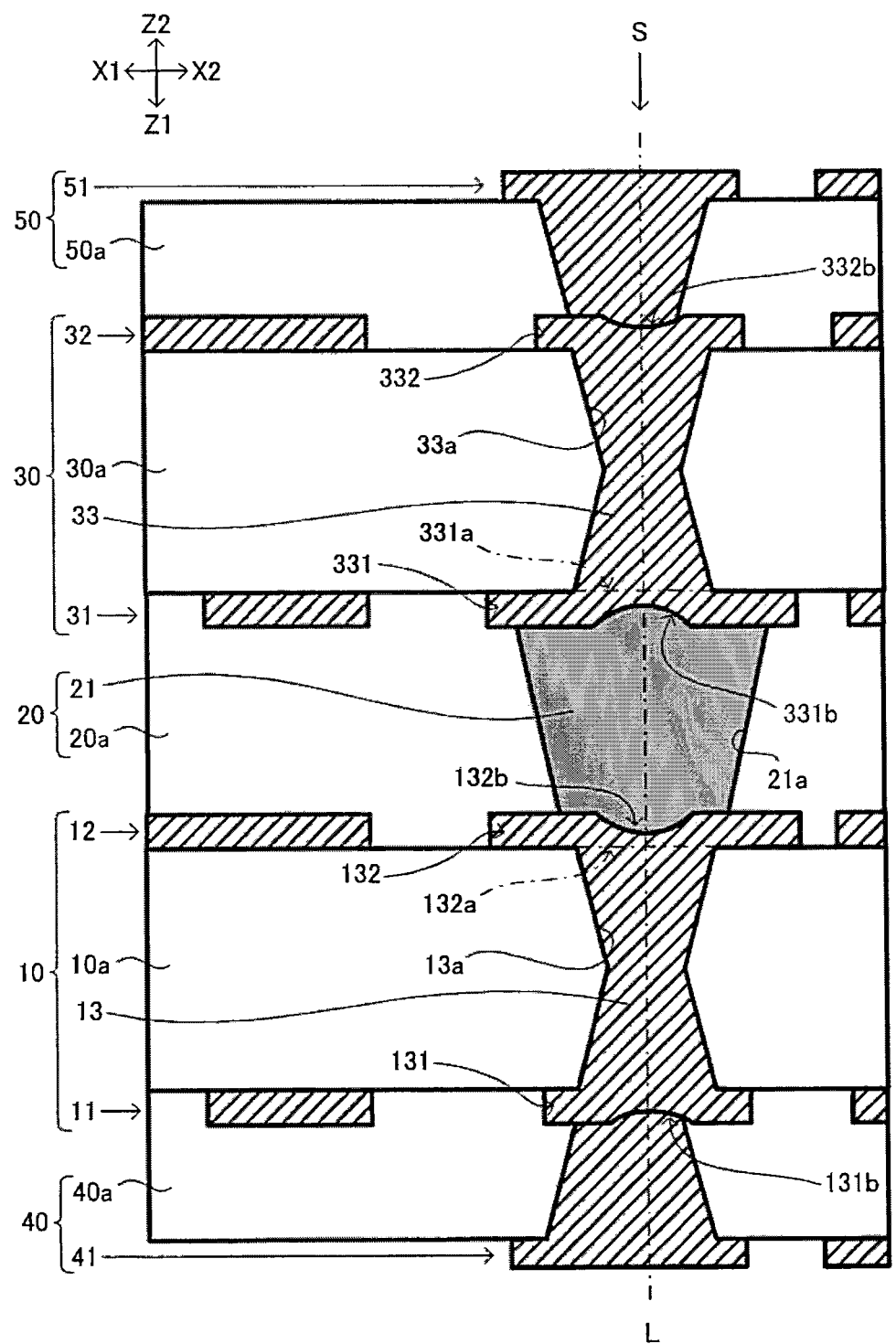
FIG. 22 is a view showing a second alternative example of a vertical cross-sectional shape of filled conductors.

The shapes of vertical cross sections of filled conductors may be formed freely. For example, as shown in FIG. 21, first filled conductor 13 and third filled conductor 33 may be formed to be tapered cylinders. Alternatively, second filled conductor 21 may be formed to be a cylinder. Furthermore, as shown in FIG. 22, first filled conductor 13 and third filled conductor 33 may be formed like a drum. The drum indicated here is a traditional Japanese small drum, whose cross section is similar to that of an hourglass. Also, second filled conductor 21 may be formed like a drum. If a hole is formed like a drum, since the diameter of the opening portions becomes greater than the diameter of the central portion, better performance may be expected when filling with plating. As a result, surface flatness features will be enhanced.

Wiring board 100 may contain electronic components and be set as an electronic device.

Figure 23:
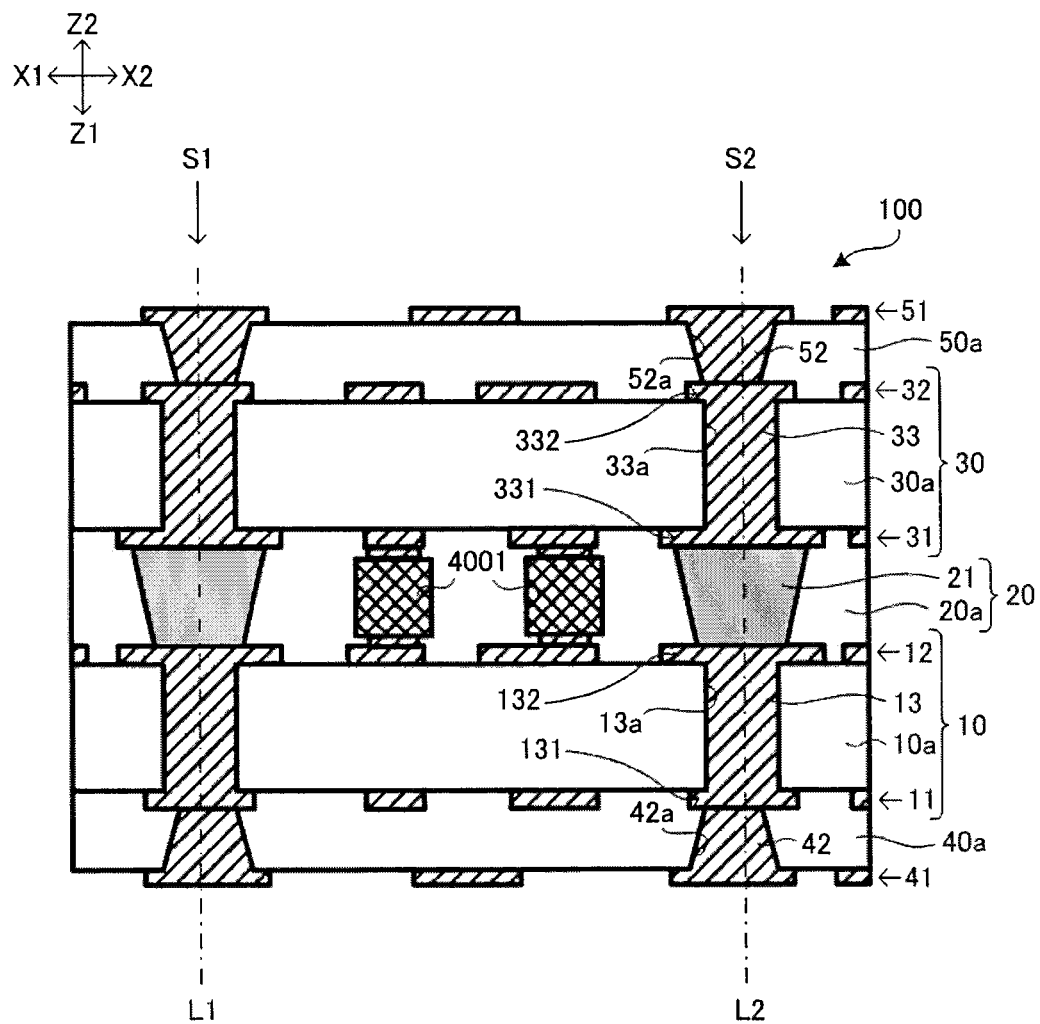
FIG. 23 is a view showing an example of a wiring board with built-in electronic components.

For example, as shown in FIG. 23, multiple electronic components 4001 may be built in wiring board 100. In an example shown in FIG. 23, two electronic components 4001 are built into the board. However, the number of electronic components is not limited specifically. For example, only one electronic component may be built into wiring board 100. Using wiring board 100 with a built-in electronic component, the electronic device may become highly functional.

Figure 24:
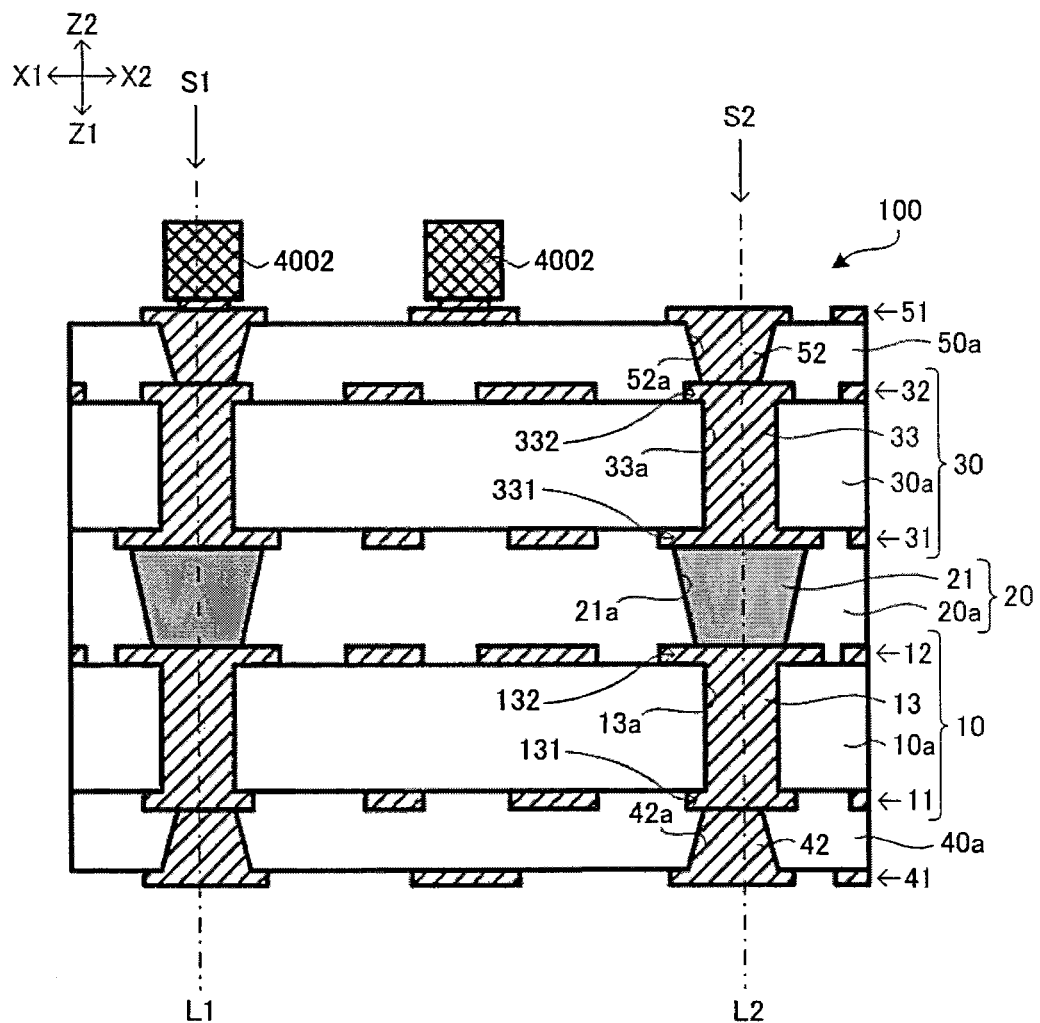
FIG. 24 is a view showing an example of a wiring board with electronic components mounted on its surface.

Also, as shown in FIG. 24, for example, multiple electronic components 4002 may be mounted on a surface of wiring board 100. In an example shown in FIG. 24, two electronic components 4002 are mounted. However, the number of electronic components is not limited specifically. For example, only one electronic component may be mounted on wiring board 100.

Regarding other factors, the structure of wiring board 100, as well as type, performance, size, quality, shape, number of layers, positioning and so forth of the elements of such a structure, may be modified freely within a scope that does not deviate from the gist of the present invention.

The number of layers in wiring board 100 is not limited specifically. For example, to achieve high functionality, they may be formed to be even more multilayered wiring boards by further continuing lamination after the structure shown in FIG. 1 is completed. Alternatively, they may be formed as a wiring board with fewer layers (for example, having only first substrate 10, second substrate 20 and third substrate 30). Yet alternatively, the number of layers on each surface (first surface, second surface) of the core section may be different.

Alternatively still, layers (wiring layers and insulation layers) may be formed (laminated) on only one surface of the core section.

The material for each wiring layer is not limited to the above, and may be modified according to usage requirements or the like. For example, metal other than copper may be used as the material for wiring layers. Also, the material for each insulation layer is not limited to a specific type. However, as for resins to form insulation layers, thermosetting resins or thermoplastic resins are preferred. As for thermosetting resins, for example, other than epoxy resin, the following may be used: imide resin (polyimide), BT resin, allyl polyphenylene ether resin (A-PPE resin) or aramid resin. Also, as for thermoplastic resins, for example, liquid-crystal polymer (LCP), PEEK resin or PTFE resin (fluoro resin) may be used. Such materials are preferred to be selected according to requirements from the viewpoint of insulation, dielectric properties, tolerance to heat, mechanical features and so forth. In addition, the above resins may contain additives such as a curing agent, a stabilizer, filler or the like. Alternatively, each wiring layer and each insulation layer may be formed with multiple layers having different materials.

In the built-up sections, conductors formed in holes (filled conductors 42, 52) may be conformal conductors.

The steps in the above embodiment are not limited to the order and contents shown in the flowchart in FIG. 5. The order and contents may be modified freely within a scope that does not deviate from the gist of the present invention. Also, unnecessary steps may be omitted according to usage requirements or the like.

The above embodiment, alternative examples and the like may be combined.

A wiring board according to one aspect of the present invention refers to either an upper surface or a lower surface as a first surface and to the other as a second surface, and has the following: a first insulation layer, a second insulation layer and a third insulation which are laminated in that order from the first surface toward the second surface; a first conductor formed by filling plating in a first hole which penetrates through the first insulation layer; a second conductor formed by filling conductive paste in a second hole which penetrates through the second insulation layer; and a third conductor formed by filling plating in a third hole which penetrates through the third insulation layer. In such a wiring board, the first conductor, the second conductor and the third conductor are positioned along the same axis and are electrically continuous with each other.

A method for manufacturing a wiring board according to another aspect of the present invention includes the following: preparing a first insulation layer having a first conductor formed by filling plating in a penetrating hole; preparing a second insulation layer having a second conductor formed by filling conductive paste in a penetrating hole; preparing a third insulation layer having a third conductor formed by filling plating in a penetrating hole; forming a laminated body by arranging the first insulation layer and the second insulation layer to sandwich the second insulation layer so that the first conductor, the second conductor and the third conductor are positioned along the same axis; and setting the first conductor, the second conductor and the third conductor to be electrically continuous with each other by pressing and heating the laminated body.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a plurality of insulating layers comprising a first insulation layer, a second insulation layer, a third insulation layer, a fourth insulation layer and a fifth insulation layer laminated in an order of the first insulation layer, the second insulation layer, the third insulation layer, the fourth insulation layer and the fifth insulation layer, wherein the first insulation layer has a first hole which penetrates through the first insulation layer and includes a first conductor comprising a plating formed in the first hole in the first insulation layer, the second insulation layer has a second hole which penetrates through the second insulation layer and includes a second conductor comprising a plating formed in the second hole in the second insulation layer, the third insulation layer has a third hole which penetrates through the third insulation layer and includes a third conductor comprising a conductive paste filled in the third hole of the third insulation layer, the fourth insulation layer has a fourth hole which penetrates through the fourth insulation layer and includes a fourth conductor comprising a plating formed in the fourth hole in the fourth insulation layer, the fifth insulation layer has a fifth hole which penetrates through the fifth insulation layer and includes a fifth conductor comprising a plating formed in the fifth hole in the fifth insulation layer, and the first conductor, the second conductor, the third conductor, the fourth conductor and the fifth conductor are formed along a same axis and are electrically continuous with each other;
   a first land connected to the second conductor and the third conductor and formed in the third insulation layer; and
   a second land connected to the third conductor and the fourth conductor and formed in the third insulation layer,
   wherein the first land has a recess formed in a central portion of the first land, the second land has a recess formed in a central portion of the second land, and the conductive paste is filled in the recess of the first land and the recess of the second land.

2. The wiring board according to claim 1, wherein at least one of the second insulation layer, the third insulation layer and the fourth insulation layer has a thickness which is set greater than a thickness of the first insulation layer and fifth insulation layer.

3. The wiring board according to claim 2, wherein the second insulation layer, the third insulation layer and the fourth insulation layer have thicknesses which are set greater than the thickness of the first insulation layer and fifth insulation layer.

4. The wiring board according to claim 2, further comprising:
   a first wiring layer formed on a first surface of the first insulation layer;
   a second wiring layer formed on a first surface of the second insulation layer and between the first and second insulation layers;
   a third wiring layer formed on a second surface of the second insulation layer and between the second and third insulation layers;
   a fourth wiring layer formed on a first surface of the fourth insulation layer and between the third and fourth insulation layers;

a fifth wiring layer formed on a second surface of the fourth insulation layer and between the fourth and fifth insulation layers; and a sixth wiring layer formed on a second surface of the fifth insulation layer, wherein at least one of the second, third, fourth and fifth wiring layers has a thickness which is set greater than a thickness of the first and sixth wiring layers.

5. The wiring board according to claim 4, wherein the second, third, fourth and fifth wiring layers have thicknesses which are set greater than the thickness of the first and sixth wiring layers.

6. The wiring board according to claim 1, further comprising:

a land connected to the second conductor and interposed between the first insulation layer and the second insulation layer, wherein the first land has a width which is set greater than a width of the land interposed between the first insulation layer and the second insulation layer.

7. The wiring board according to claim 1, further comprising:

a land connected to the fourth conductor and interposed between the fourth insulation layer and the fifth insulation layer, wherein the second land has a width which is set greater than a width of the land interposed between the fourth insulation layer and the fifth insulation layer.

8. The wiring board according to claim 1, further comprising:

a land connected to the second conductor and interposed between the first insulation layer and the second insulation layer; and a land connected to the fourth conductor and interposed between the fourth insulation layer and the fifth insulation layer, wherein the first land has a width which is set greater than a width of the land interposed between the first insulation layer and the second insulation layer, and the second land has a width which is set greater than a width of the land interposed between the fourth insulation layer and the fifth insulation layer.

9. The wiring board according to claim 1, wherein the second hole has an opening facing an opening of the third hole, and the opening of the third hole has a width which is set greater than a width of the opening of the second hole.

10. The wiring board according to claim 1, wherein the third hole has an opening facing an opening of the fourth hole, and the opening of the third hole has a width which is set greater than a width of the opening of the fourth hole.

11. The wiring board according to claim 1, wherein the second hole has an opening facing an opening of the third hole, the opening of the third hole has a width which is set greater than a width of the opening of the second hole, the third hole has an opening facing an opening of the fourth hole, and the opening of the third hole has a width which is set greater than a width of the opening of the fourth hole.

12. The wiring board according to claim 1, wherein the second conductor has a recess formed in a central portion of an end surface facing the first insulation layer.

13. The wiring board according to claim 1, wherein the fourth conductor has a recess formed in a central portion of an end surface facing the fifth insulation layer.

14. The wiring board according to claim 1, wherein the second conductor has a recess formed in a central portion of an end surface facing the first insulation layer, and the fourth conductor has a recess formed in a central portion of an end surface facing the fifth insulation layer.

15. The wiring board according to claim 1, further comprising a built-in electronic component positioned in the wiring board.

16. The wiring board according to claim 1, further comprising an electronic component mounted on a surface of the wiring board.

* * * * *